US012604602B2

(12) United States Patent
Won et al.

(10) Patent No.: US 12,604,602 B2
(45) Date of Patent: Apr. 14, 2026

(54) DISPLAY APPARATUS

(71) Applicant: LG Display Co., Ltd., Seoul (KR)

(72) Inventors: Jeongeun Won, Seoul (KR);
Seungryong Joung, Seoul (KR);
Chunki Kim, Seoul (KR); Yosub Lee,
Goyang-si (KR)

(73) Assignee: LG Display Co., Ltd., Seoul (KR)

( * ) Notice: Subject to any disclaimer, the term of this
patent is extended or adjusted under 35
U.S.C. 154(b) by 338 days.

(21) Appl. No.: 18/358,858

(22) Filed: Jul. 25, 2023

(65) Prior Publication Data

US 2024/0049495 A1 Feb. 8, 2024

(30) Foreign Application Priority Data

Jul. 26, 2022 (KR) ........................ 10-2022-0092784

(51) Int. Cl.
*H10K 50/13* (2023.01)
*H10K 50/15* (2023.01)
*H10K 59/12* (2023.01)

(52) U.S. Cl.
CPC ........... *H10K 50/13* (2023.02); *H10K 50/156*
(2023.02); *H10K 59/12* (2023.02)

(58) Field of Classification Search
CPC ....... H10K 50/13; H10K 50/156; H10K 59/12
See application file for complete search history.

(56) References Cited

U.S. PATENT DOCUMENTS

| | | | |
|---|---|---|---|
| 2019/0006434 A1* | 1/2019 | Hua ........................ | H10K 59/32 |
| 2025/0126965 A1* | 4/2025 | Li ........................... | H10K 50/80 |

FOREIGN PATENT DOCUMENTS

| | | |
|---|---|---|
| KR | 10-0805270 B1 | 2/2008 |
| KR | 10-2013-0132843 A | 12/2013 |
| KR | 10-2017-0080287 A | 7/2017 |
| KR | 10-2021-0015958 A | 2/2021 |
| KR | 10-2022-0058881 A | 5/2022 |

* cited by examiner

*Primary Examiner* — Anne M Hines
(74) *Attorney, Agent, or Firm* — Seed Intellectual
Property Law Group LLP

(57) ABSTRACT

A display apparatus according to an example embodiment of
the present disclosure includes a cathode electrode over a
substrate, a first emission part over the cathode electrode, the
first emission part including a first electron transport layer,
a first emission layer, a first hole transport layer, and a first
charge generation layer, a second emission part over the first
emission part, the second emission part including a second
charge generation layer, a second electron transport layer, a
second emission layer, a second hole transport layer, and a
third charge generation layer, a third emission part over the
second emission part, the third emission part including a
fourth charge generation layer, a third electron transport
layer, a third emission layer, and a third hole transport layer,
and an anode electrode over the third emission part. A
thickness of the third electron transport layer may be larger
than a thickness of the second electron transport layer.

28 Claims, 9 Drawing Sheets

300

300

DISPLAY APPARATUS

CROSS-REFERENCE TO RELATED APPLICATIONS

This application claims the benefit of and priority to Korean Patent Application No. 10-2022-0092784 filed on Jul. 26, 2022, in the Korean Intellectual Property Office, the entirety of which is hereby incorporated herein by reference for all purposes as if fully set forth herein.

BACKGROUND

Technical Field

The present disclosure relates to a display apparatus.

Description of the Related Art

Examples of the display apparatuses include a liquid crystal display apparatus, a field emission display apparatus, and a light emitting display apparatus. Among the display apparatuses, the light emitting display apparatus may be a self-emitting display apparatus. The self-emitting display apparatus includes a plurality of sub pixels and includes a light emitting structure in each sub pixel without having a separate light source to emit light. The self-emitting display apparatus is being developed a lot with advantages of fast response speed, high luminous efficiency, high luminance, and a large viewing angle, as compared with the other display apparatus.

A light emitting display apparatus has high resolution and high integration, and a tandem device that does not require a fine metal mask and commonly configures an organic layer and an emission layer is advantageous in terms of process, and research is being conducted on this.

BRIEF SUMMARY

A display apparatus may configure two or more emission parts between two electrodes. To adjust an emission position of the emission layer included in the emission part, a thickness of an electron transport layer may be increased. In this case, as the thickness of the electron transport layer is increased, there is a problem in that a driving voltage is increased so that the viewing angle characteristic is degraded due to the increased thickness of the entire light emitting structure.

Accordingly, the inventors of the present disclosure recognized the above-mentioned problems and conducted extensive research and experiments to reduce the driving voltage of the display apparatus and to improve the viewing angle characteristic. The inventors invented a novel display apparatus of the disclosure, which reduces the driving voltage and improves the viewing angle characteristic through extensive research and experiments.

An aspect of the example embodiments of the present disclosure provides a display apparatus which reduces a driving voltage and improves a viewing angle characteristic.

Accordingly, embodiments of the present disclosure are directed to an apparatus that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and aspects of the present disclosure, as embodied and broadly described herein, in one or more aspects, a display apparatus may comprise a cathode electrode over a substrate, a first emission part over the cathode electrode, the first emission part including a first electron transport layer, a first emission layer, a first hole transport layer, and a first charge generation layer, a second emission part over the first emission part, the second emission part including a second charge generation layer, a second electron transport layer, a second emission layer, a second hole transport layer, and a third charge generation layer, a third emission part over the second emission part, the third emission part including a fourth charge generation layer, a third electron transport layer, a third emission layer, and a third hole transport layer, and an anode electrode over the third emission part. A thickness of the third electron transport layer may be larger than a thickness of the second electron transport layer.

In one or more aspects, a display apparatus may comprise a first electrode and a second electrode over a substrate, a first emission part over the first electrode, the first emission part being between a first charge generation layer and a second charge generation layer, a second emission part over the first emission part, the second emission part being between a third charge generation layer and a fourth charge generation layer, and a third emission part over the second electrode, the third emission part being between a fifth charge generation layer and a second electrode. A thickness of the third emission part including a fifth charge generation layer may be larger than a thickness of the second emission part including the third charge generation layer and the fourth charge generation layer.

According to one or more example embodiment of the present disclosure, a display apparatus includes a light emitting structure in which a thickness of an organic layer of an emission part is reduced to reduce a driving voltage and improve an efficiency and/or viewing angle characteristic.

According to one or more example embodiments of the present disclosure, a display apparatus may include a light emitting structure in which a thickness of an organic layer of an emission part is reduced, in a pixel driving circuit part to improve an aperture ratio.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the claims. Nothing in this section should be taken as a limitation on the claims. Further aspects and advantages are discussed below in conjunction with aspects of the disclosure.

It is to be understood that both the foregoing general description and the following detailed description of the present disclosure are illustrative and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
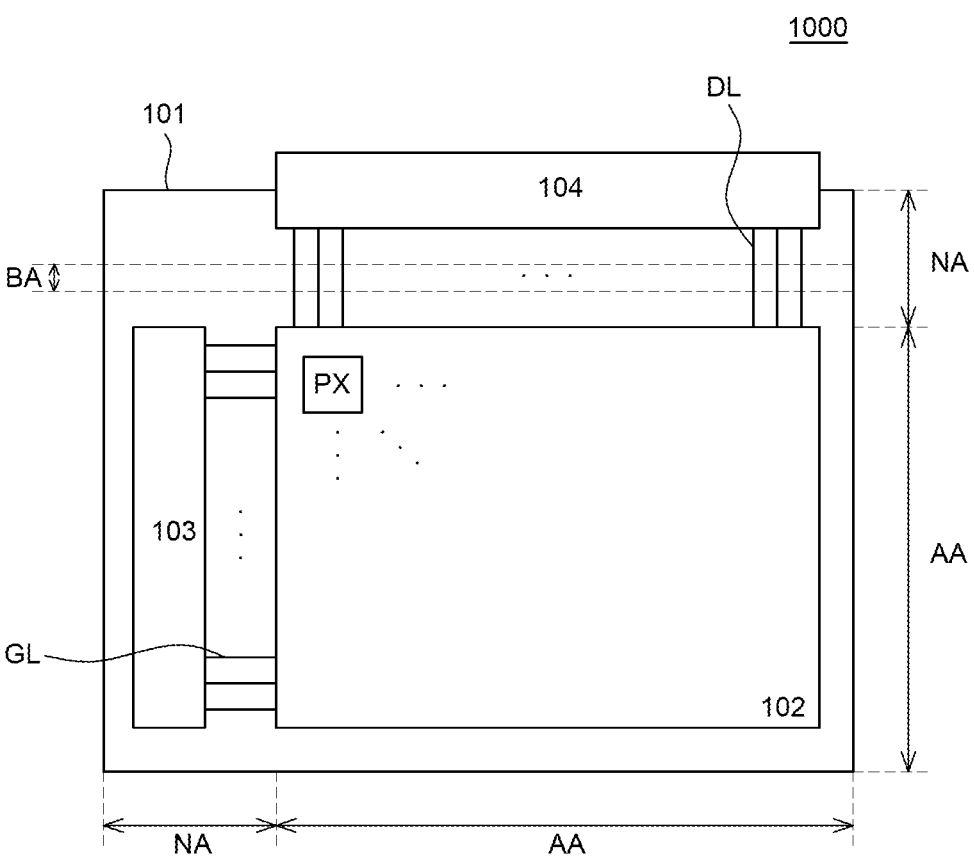
FIG. 1 illustrates a display apparatus according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Same reference numerals designate same elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, dimensions (e.g., length, width, height, thickness, radius, diameter, area, etc.), a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a positional relationship, where the positional relationship between two parts is described, for example, using "on," "over," "under," "above," "below," "beneath," "near," "close to," "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case which is not continuous may be included unless "just," "immediate(ly)," or "direct(ly)" is used.

It will be understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing the elements of the present disclosure, the terms "first," "second," "A," "B," "(a)," "(b)," or the like may be used. These terms are intended to identify the corresponding element(s) from other element(s), and these are not used to define the essence, basis, order, or number of the elements.

For the expression that an element or layer is "connected," "coupled," "attached," or "adhered" to another element or layer, the element or layer can not only be directly connected, coupled, attached, or adhered to another element or layer, but also be indirectly connected, coupled, attached, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all elements proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In an example, an expression "among a plurality of elements" may be understood as between a plurality of elements. In one or more examples, the number of elements may be two. In one or more examples, the number of elements may be more than two.

In one or more aspects, the phrases "one or more among" and "one or more of" may be used interchangeably simply for convenience unless stated otherwise.

Features of various embodiments of the present disclosure may be partially or wholly coupled to or combined with each other, and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

For convenience of description, understanding and illustration in some of the figures, a scale, dimension, size, and thickness of each of the elements illustrated in the accompanying drawings might be different from an actual scale, dimension, size, and thickness, to illustrate a feature for the clarity, and thus, the embodiments of the present disclosure are not limited to a scale, dimension, size, and thickness illustrated in the drawings.

FIG. 1 illustrates a display apparatus according to an example embodiment of the present disclosure.

Referring to FIG. 1, a display apparatus 1000 according to an example embodiment of the present disclosure may include a display panel 102. The display panel 102 may include a display area (or an active area) AA provided on the substrate 101 and a non-display area (or a non-active area) NA disposed in vicinity periphery (or around) of the display area AA. The substrate 101 may be formed with a plastic material having a flexibility to be bendable. For example, the substrate 101 may be configured with a material such as polyimide (PI), polyethylene terephthalate (PET), polyethylene naphthalate (PEN), polycarbonate (PC), polyethersulfone (PES), polyarylate (PAR), polysulfone (PSF), and cyclo-olefin copolymer (COC), but example embodiments of the present disclosure are not limited thereto. For example, as the material of the substrate 101, glass may be included.

In the display area AA, a plurality of data lines and a plurality of gate lines may be disposed. For example, the plurality of data lines may be disposed in rows or columns, and the plurality of gate lines may be disposed in columns or rows. A sub pixel PX may be disposed in an area that includes the data line and/or the gate line. The display area AA may be an active area or a pixel area, but example embodiments of the present disclosure are not limited thereto. The non-display area AA may be a non-active area or a non-pixel area, but example embodiments of the present disclosure are not limited thereto.

The sub pixel PX in the display area AA may include a thin film transistor formed of a semiconductor layer. For example, the semiconductor layer may include an oxide semiconductor material, and example embodiments of the present disclosure are not limited thereto.

According to an example embodiment of the present disclosure, in the non-display area NA, a gate driver 103 including a gate driving circuit may be disposed. The gate driving circuit of the gate driver 103 sequentially supplies a scan signal to a plurality of gate lines GL to sequentially drive each pixel row of the display area AA. For example, the pixel row may be a row formed by pixels connected to one gate line GL. The gate driving circuit may be referred to as a scan driving circuit, but is not limited by a term.

The gate driving circuit may include a thin film transistor having a polycrystalline semiconductor layer or a thin film transistor having an oxide semiconductor layer, but example embodiments of the present disclosure are not limited thereto. According to another example embodiment of the present disclosure, the gate driving circuit may include one pair of a thin film transistor having a polycrystalline semiconductor layer and a thin film transistor having an oxide semiconductor layer. When the same semiconductor material is used for the thin film transistors disposed at the non-display area NA and the display area AA, the thin film transistors may be simultaneously configured in a same process, but example embodiments of the present disclosure are not limited thereto.

The gate driving circuit may include a shift register and a level shifter, but example embodiments of the present disclosure are not limited thereto.

As in the display apparatus 1000 according to an example embodiment of the present disclosure, the gate driving circuit is implemented in a gate in panel (GIP) type to be directly disposed at the substrate 101.

The gate driving circuit 103 including the gate driving circuit may sequentially supply a scan signal of an on-driving voltage or an off-driving voltage to the plurality of gate lines GL.

The gate driver 103 according to an example embodiment of the present disclosure may be directly formed on the substrate 101 using the thin film transistor which uses the polycrystalline semiconductor material as an active layer (or a semiconductor layer). Further, the gate driver 103 may be formed by configuring the CMOS with a thin film transistor using a polycrystalline semiconductor material as an active layer (or a semiconductor layer) and a thin film transistor using an oxide semiconductor material as an active layer (or a semiconductor layer).

The thin film transistor having an oxide semiconductor layer and the thin film transistor having a polycrystalline semiconductor layer may have a high electron mobility in the channel to implement high resolution and low power.

The display apparatus 1000 according to an example embodiment of the present disclosure may further include a data driver 104 including a data driving circuit. When a specific gate line GL is open by the gate driver 103 including the gate driving circuit, the data driving circuit converts image data into an analog data driving voltage to supply the data driving voltage to the plurality of data lines DL.

The plurality of gate lines GL disposed at the substrate 101 may include a plurality of scan lines and a plurality of emission control lines. The plurality of scan lines and the plurality of emission control lines are lines which transmit different types of gate signals (a scan signal or an emission control signal) to a gate node of different types of transistors (a scan transistor or an emission control transistor).

The gate driver 103 including the gate driving circuit may include a scan driving circuit which outputs scan signals to a plurality of scan lines which is one type of gate lines and an emission driving circuit which outputs emission control signals to a plurality of emission control lines which is another type of gate line.

The display panel 102 according to an example embodiment of the present disclosure may further include a bending area BA in which the substrate 101 is curved. The bending area BA may be an area where the substrate 101 is bent. The substrate 101 may be maintained in a flat state in an area excluding the bending area BA.

The data line DL may be disposed so as to pass through the bending area BA and various data lines DL are disposed to be connected to the data pad.

Figure 2:
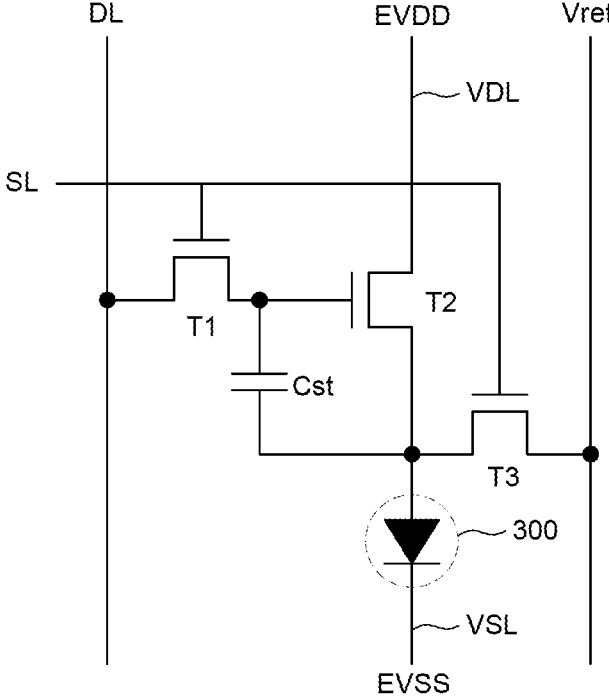
FIG. 2 illustrates a pixel driving circuit of a display apparatus according to an example embodiment of the present disclosure.
Figure 3:
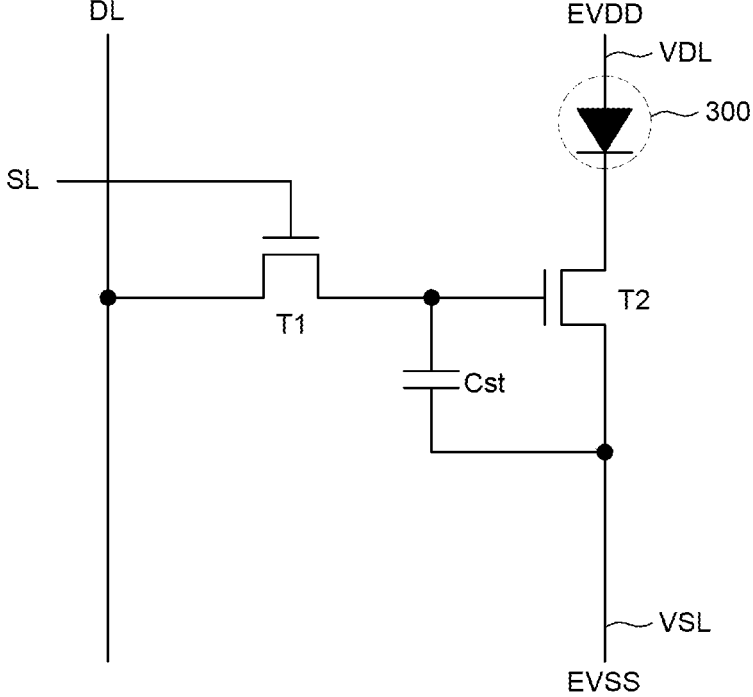
FIG. 3 illustrates a pixel driving circuit of a display apparatus according to another example embodiment of the present disclosure.

FIG. 2 illustrates a pixel driving circuit of a display apparatus according to an example embodiment of the present disclosure. FIG. 3 illustrates a pixel driving circuit of a display apparatus according to another example embodiment of the present disclosure.

Referring to FIGS. 2 and 3, the substrate 101 may include a plurality of sub pixels PX. The substrate may include a pixel driving circuit part disposed at the plurality of sub pixels PX.

For example, it is described that the semiconductor layer of the driving transistor according to an example embodiment of the present disclosure includes an oxide semiconductor layer, and the semiconductor layer of the switching transistor includes an oxide semiconductor layer. For example, at least one of the switching transistor for internal compensation may include a polycrystalline semiconductor, but example embodiments of the present disclosure are not limited thereto.

Referring to FIG. 2, the display apparatus according to an example embodiment of the present disclosure may include a driving circuit including three transistors T1, T2, and T3 and one storage capacitor Cst. One of three transistors T1, T2, and T3 is a driving transistor and the remaining transistors are switching transistors for internal compensation, but example embodiments of the present disclosure are not limited thereto. For example, the present disclosure is not limited to example embodiment illustrated in FIG. 2, but may be applied to internal compensation circuits with various configurations.

The pixel driving circuit part according to an example embodiment of the present disclosure may include a first transistor T1, a second transistor T2, a third transistor T3, and a storage capacitor Cst. The first transistor T1 may be a switching transistor, but example embodiments of the present disclosure are not limited thereto. The second transistor T2 may be a driving transistor, but example embodiments of the present disclosure are not limited thereto. The third transistor T3 may be a switching transistor or a sensing transistor, but example embodiments of the present disclosure are not limited thereto.

The first transistor T1 may be provided in an intersection between the scan line SL and/or a data line DL. The second transistor T2 may be connected to the first transistor T1 and an anode electrode of a light emitting structure 300. The storage capacitor Cst may be connected between a connection node of the first transistor T1 and the second transistor T2, and a source electrode of the second transistor T2. The drain electrode of the second transistor T2 is connected to a driving power voltage line VDL to be applied with a driving power voltage EVDD and the cathode electrode of the light emitting structure 300 is connected to a ground power voltage line VSL to be supplied with a ground power voltage EVSS. A gate electrode of the first transistor T1 is connected to the scan line SL to be supplied with a scan signal and the second transistor T2 is connected to the first transistor T1 to be turned on according to a signal transmitted from the first transistor T1.

A gate electrode of the third transistor T3 is connected to the scan line SL, a source electrode is connected to a reference voltage line Vref, and a drain electrode may be connected to the anode electrode of the light emitting structure 300.

The third transistor T3 may be a compensation circuit for compensating for degradation or a threshold voltage of the second transistor T2 and the light emitting structure 300. The third transistor T3 may operate to acquire a sensing voltage through a sensing node between the second transistor T2 and the light emitting structure 300. The sensing voltage acquired from the third transistor T3 may be transmitted to a compensation circuit part through a reference voltage line Vref.

Referring to FIG. 3, the display apparatus according to another example embodiment of the present disclosure may include a driving circuit including two transistors T1 and T2 and one storage capacitor Cst. One of two transistors T1 and T2 is a driving transistor and the remaining transistor may be a switching transistor for internal compensation, but the example embodiments of the present disclosure are not limited thereto. For example, the present disclosure is not limited to the example embodiment illustrated in FIG. 3, but may be applied to internal compensation circuits with various configurations.

The pixel driving circuit part according to an example embodiment of the present disclosure may include a first transistor T1, a second transistor T2, and a storage capacitor Cst. The first transistor T1 may be a switching transistor, but the example embodiments of the present disclosure are not limited thereto. The second transistor T2 may be a driving transistor, but the example embodiments of the present disclosure are not limited thereto.

The first transistor T1 may be provided in an intersection between the scan line SL and/or a data line DL. The second transistor T2 may be connected to the first transistor T1 and the cathode electrode of a light emitting structure 300. The storage capacitor Cst may be connected between a connection node of the first transistor T1 and the second transistor T2 and a source electrode of the second transistor T2. The anode electrode of the light emitting structure 300 is connected to a driving power voltage line VDL to be applied with a driving power voltage EVDD and the source electrode of the second transistor T2 is connected to a ground power voltage line VSL to be supplied with a ground power voltage EVSS. A gate electrode of the first transistor T1 is connected to the scan line SL to be supplied with a scan signal and the second transistor T2 is connected to the first transistor T1 to be turned on according to a signal transmitted from the first transistor T1.

In the display apparatus of the present disclosure, the anode electrode of the light emitting structure 300 is connected to a driving power voltage line VDL and the cathode electrode may be connected to the drain electrode of the second transistor T2. Accordingly, when the driving power voltage EVDD is applied to the driving voltage line VDL while the second transistor T2 is turned on, a current path is formed in the light emitting structure 300 to emit light. Accordingly, the light emitting structure 300 may emit light regardless of degradation of the second transistor T2. Accordingly, it is not necessary to dispose a separate sensing transistor for initialization or a reference voltage line Vref which applies an initialization voltage so that a configuration of the pixel driving circuit part may be simplified. In a bottom emission type in which the light emission is performed through the substrate 101, a placement of the pixel driving circuit part may be simplified so that the placement of the light emitting structure may be maximized. Thus, a display apparatus with an improved aperture ratio may be provided.

It is described that in the display apparatus according to an example embodiment of the present disclosure, a first transistor T1 and a second transistor T2 included in the sub pixel PX are n-types as an example, but the example embodiments of the present disclosure are not limited thereto.

In the sub pixel PX, when a data signal and a scan signal are supplied from the data driver 104 and the gate driver 103 through the data line DL and the scan line SL to switch the first transistor T1, a current path is formed in the driving power voltage line VDL, the light emitting structure 300, the second transistor T2, and the ground power voltage line VSS. Accordingly, the light emitting structure 300 may emit light.

Figure 4:
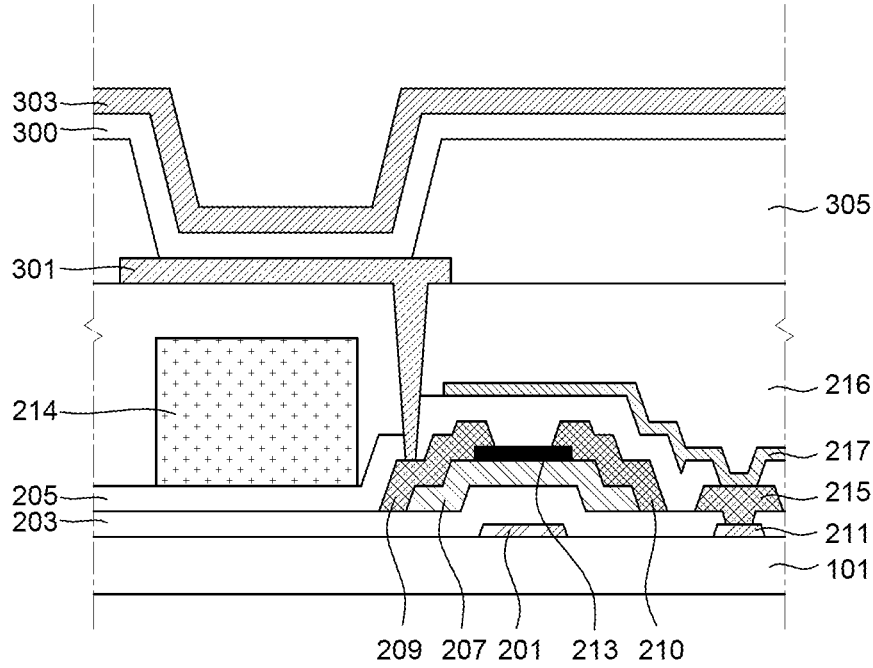
FIG. 4 illustrates a display apparatus according to an example embodiment of the present disclosure.

FIG. 4 is a cross-sectional view of one sub pixel of a display apparatus according to an example embodiment of the present disclosure.

According to an example embodiment of the present disclosure, an aperture ratio of a display apparatus to which a pixel driving circuit described in FIG. 3 is applied is improved by approximately 17.5% more than the display apparatus to which a pixel driving circuit described in FIG. 2 is applied. Extensive research and experiments were conducted to implement a light emitting device (or a light emitting structure) to which the pixel driving circuit described in FIG. 3 is applied. A light emitting structure with an aperture ratio to be improved was invented through extensive research and experiments.

Referring to FIG. 4, a transistor, e.g., the second transistor T2 of FIG. 3, of the pixel driving circuit part may include a gate electrode 201, a source electrode 209, and a drain electrode 210.

The gate electrode 201 may be disposed on the substrate 101. The gate electrode 201 may be formed of a single layer or a plurality of layers formed of any one of aluminum (Al), chrome (Cr), copper (Cu), gold (Au), titanium (Ti), nickel (Ni), neodymium (Nd), molybdenum (Mo), and tungsten (W), or an alloy thereof, but embodiments of the present disclosure are not limited thereto. For example, the gate electrode 201 may be configured as a double layer (or a dual layer or two layers), and may be configured as three or more of a plurality of layers, but example embodiments of the present disclosure are not limited thereto. For example, when the gate electrode 201 includes double or more layers, at least one of the double or more layers may be used as a barrier layer which suppresses the influence of impurities or moisture entering from a lower portion of the substrate 101 on the semiconductor layer 207.

The transistor according to an example embodiment of the present disclosure has a bottom gate structure, but example embodiments are not limited thereto. For example, the transistor may be configured with a top gate structure.

A first insulating layer 203 may be disposed on the gate electrode 201. The first insulating layer 203 may be a buffer layer, but is not limited by the term. For example, the first insulating layer 203 may include a silicon oxide layer (SiOx), a silicon nitride layer (SiNx), or a double layer (or two layers) of a silicon oxide layer (SiOx) and a silicon nitride layer (SiNx), but example embodiments of the present disclosure are not limited thereto. For example, the first insulating layer 203 may include at least one or more layers, but example embodiments of the present disclosure are not limited thereto.

A first connection line 211 may be disposed on a same layer as the gate electrode 201. The first connection line 211 may include a same material as the gate electrode 201, but example embodiments of the present disclosure are not limited thereto.

A semiconductor layer 207 may be disposed on the first insulating layer 203. The semiconductor layer 207 may be disposed the gate electrode 201 and the first insulating layer 203 therebetween. The semiconductor layer 207 may be any one of an oxide semiconductor layer, polysilicon, and amorphous silicon, or formed by laminating two or more layers of the layers, but example embodiments of the present disclosure are not limited thereto. When the semiconductor layer 207 includes the oxide semiconductor layer and the poly silicon, the semiconductor layer 207 may be formed by a crystallization process. When the semiconductor layer 207 is formed of oxide semiconductor, the semiconductor layer may be formed of indium tin oxide (ITO), indium zinc oxide (IZO), or indium tin zinc oxide (ITZO), but example embodiments of the present disclosure are not limited thereto.

An etch stop layer 213 is on the semiconductor layer 207, which may suppress or prevent the over etching in channel portion. According to another example embodiment of the present disclosure, the etch stop layer 213 may be omitted.

A source electrode 209 and a drain electrode 210 may be configured on both sides of the semiconductor layer 207. The source electrode 209 and the drain electrode 210 are disposed on both sides of the semiconductor layer 207 to be spaced apart from each other. The source electrode 209 and the drain electrode 210 each may be partially on the etch stop layer 213, and the etch stop layer 213 may be positioned between the source electrode 209 and the drain electrode 210.

The source electrode 209 and the drain electrode 210 may include a same metal, but embodiments of the present disclosure are not limited thereto. For example, the source electrode 209 and the drain electrode 210 may be formed of a single layer or a plurality of layers formed of any one of aluminum (Al), chrome (Cr), copper (Cu), gold (Au), titanium (Ti), nickel (Ni), neodymium (Nd), molybdenum (Mo), and tungsten (W), or an alloy thereof, but embodiments of the present disclosure are not limited thereto.

In the example embodiments of the present disclosure, the source electrode 209 and the drain electrode 210 are distinguished for the convenience of description, and the source electrode 209 and the drain electrode 210 may be switched each other. For example, the source electrode may be a drain electrode and the drain electrode may be a source electrode. According to another example embodiment of the present disclosure, a source electrode of any one example embodiment may be a drain electrode of another example embodiment, and a drain electrode of any one example embodiment may be a source electrode of another example embodiment.

In the same process of forming the second transistor T2, the scan line SL, the data line DL, the driving power voltage line VDL, the ground power voltage line VSL, the first transistor T1, and the storage capacitor Cst which have been described in FIG. 3 may be formed together. The ground power voltage line VSL may be connected to the first connection line 211 on the same layer with the gate electrode 201 of FIG. 4 and to the second connection line 217 through an interconnection structure 215 that is on the same layer as the drain electrode 210 and the source electrode 209 to be configured on the substrate 101. The interconnection structure 215 may be disposed on the first insulating layer 203.

The first transistor T1 and the second transistor T2 may be protected by the second insulating layer 205. The second connection line 217 may be disposed on the second insulating layer 205. The second connection line 217 may be further disposed on the source electrode 209. For example, the second insulating layer 205 may include a silicon oxide layer (SiOx), a silicon nitride layer (SiNx), or aluminum oxide ($Al_2O_3$), but example embodiments of the present disclosure are not limited thereto. As another example embodiment of the present disclosure, the second insulating layer 205 may have a double layered structure in which a silicon oxide layer (SiOx) and a silicon nitride layer (SiNx) are formed, but example embodiments of the present disclosure are not limited thereto. The second insulating layer 205 may be a gate insulating layer, but is not limited by the term.

According to an example embodiment of the present disclosure, a color filter 214 may be included on the second insulating layer 205. For example, the color filter 214 may be disposed in a portion of the second insulating layer 205. Light of a wavelength which selectively transmits the color filter 214 may be transmitted toward the substrate 101. For example, the color filter 214 may be configured for every sub pixel PX. For example, when the sub pixel PX includes a red sub pixel, a green sub pixel, and a blue sub pixel, the color filter 214 may be configured to correspond to each of a red sub pixel, a green sub pixel, and a blue sub pixel.

A passivation layer (or a protection layer) 216 may be disposed on the color filter 214. For example, the color filter 214 may be disposed on the substrate 101 and the second insulating layer 205. The passivation layer 216 may include an organic material, but example embodiments of the present disclosure are not limited thereto. For example, the passivation layer 216 may be formed of acrylic resin or polyimide resin, but example embodiments of the present disclosure are not limited thereto. The passivation layer 216 may be an overcoating layer or a planarization layer, but is not limited by the term.

The cathode electrode 301 may be disposed on the passivation layer 216. For example, the cathode electrode 301 may be formed of gold (Au), silver (Ag), aluminum (Al), molybdenum (Mo), magnesium (Mg), lithium (Li), calcium (Ca), lithium fluoride (LiF), silver-magnesium (Ag: Mg), or indium tin oxide (ITO), indium zinc oxide (IZO), and indium gallium zinc oxide (IGZ) which are transparent conductive materials, such as transparent conductive oxide (TCO). The cathode electrode 301 may be formed as a single layer or a plurality of layers thereof, but example embodiments of the present disclosure are not limited thereto. As another example embodiment of the present disclosure, a reflective electrode is further configured below the cathode electrode 301 to reflect the light toward the anode electrode 303.

For example, the color filter 214 may be disposed below the cathode electrode 301. For example, the color filter 214 may be disposed between the second insulating layer 205 and the cathode electrode 301.

The cathode electrode 301 may be connected to the source electrode 209 of the transistor through a contact hole which passes through the passivation layer 216 and the second insulating layer 205.

The bank 305 may be configured to expose emission parts of sub pixels PX. For example, the bank 305 may expose the cathode electrode 301 of each sub pixel PX. The bank 305 may overlap a portion of the cathode electrode 301. The bank 305 may be disposed on the cathode electrode 301. The bank 305 may divide the plurality of sub pixels PX. The bank 305 may be a pixel definition layer, but is not limited by a term. The bank 305 minimizes light glare phenomenon between adjacent sub pixels PX and may suppress or prevent light interference. The bank 305 may suppress or prevent color mixture caused at various viewing angles. The bank 305 may be formed of an opaque material, for example, formed of black material. In this case, the bank 305 may include a light shielding material which is formed of any one or more of a color pigment, organic black, and carbon, but example embodiments of the present disclosure are not limited thereto. For example, the bank 305 may be formed of a material such as silicon nitride (SiNx) and silicon oxide (SiOx), or at least one or more materials such as benzocyclobutene (BCB), acrylic resin, epoxy resin, phenolic resin, polyamide resin, or polyimide resin, but example embodiments of the present disclosure are not limited thereto.

A spacer (not shown) may be further disposed on the bank 305. The spacer may minimize the display apparatus from being broken due to the external impact by buffering an empty space between the substrate 101 on which the light emitting structure 300 is formed and the upper substrate. The spacer may be formed of a same material as the bank 305 and the spacer may be formed simultaneously with the bank 305, but example embodiments of the present disclosure are not limited thereto.

According to an example embodiment of the present disclosure, the light emitting structure 300 may be disposed on the cathode electrode 301. The light emitting structure 300 may include two or more emission parts, but example embodiments of the present disclosure are not limited thereto. The light emitting structure 300 will be described below with reference to FIG. 5.

The anode electrode 303 may be disposed on the light emitting structure 300. For example, the light emitting structure 300 may be disposed between the cathode electrode 301 and the anode electrode 303. It should be noted that in various embodiments, the positions and structure configurations of the anode electrode and the cathode electrode may vary. For example, in some embodiments, element 301 may be configured as an anode electrode and element 303 may be configured as a cathode electrode.

According to an example embodiment of the present disclosure, an encapsulation part may be further disposed in the anode electrode 303. The encapsulation part may suppress or prevent a permeation of oxygen or moisture from the outside to protect the light emitting structure 300.

The encapsulation part may include a first encapsulation layer, a second encapsulation layer, and a third encapsulation layer, but example embodiments of the present disclosure are not limited thereto. For example, the encapsulation layer may be formed by a plurality of layers in which different inorganic materials may be laminated, or formed by a plurality of layers in which inorganic materials and organic materials are alternately laminated, but example embodiments of the present disclosure are not limited thereto. For example, the encapsulation part may include at least two encapsulation layers, but example embodiments of the present disclosure are not limited thereto. For example, the encapsulation part may have a slant or an inclined surface at an outer periphery of the display area AA or inside the non-display area NA.

The first encapsulation layer and the third encapsulation layer may include one or more materials of a silicon oxide layer (SiOx), a silicon nitride layer (SiNx), and aluminum oxide (AlyOz), but example embodiments of the present disclosure are not limited thereto.

The second encapsulation layer may cover foreign materials or particles which may be generated during a manufacturing process. The second encapsulation layer may planarize a surface of the first encapsulation layer. For example, the second encapsulation layer may include at least one or more materials of acryl resin, epoxy resin, phenolic resin, polyamide resin, polyimide resin, silicon oxy carbon (SiOCz), and polyethylene, but example embodiments of the present disclosure are not limited thereto. The first encapsulation layer, the second encapsulation layer, and the third encapsulation layer may be sequentially laminated, but example embodiments of the present disclosure are not limited thereto. For example, the first encapsulation layer formed with an inorganic material, the second encapsulation layer formed with an organic material, and the third encapsulation layer formed with an inorganic material may be sequentially laminated, but example embodiments of the present disclosure are not limited thereto.

According to an example embodiment of the present disclosure, a touch part may be further disposed on the encapsulation part. For example, a touch part for recognizing the touch of the user may be disposed on the encapsulation part.

The touch part may include an insulating layer, a touch electrode part, and a passivation layer (or a protection layer). For example, the insulating layer may be a touch insulating layer, a lower insulating layer, or a lower touch insulating layer, but is not limited by the term. For example, the passivation layer may be a touch insulating layer, an upper insulating layer, or an upper touch insulating layer, but is not limited by the term.

The touch electrode part may include a plurality of touch electrodes to sense the touch of the user. The plurality of touch electrodes may serve as a touch sensor to sense a user's touch according to a mutual capacitive manner or a self-capacitance manner. The touch electrode part includes a plurality of first touch electrodes disposed in a first direction and a plurality of second touch electrodes disposed in a second direction perpendicular to the first direction, on the same plane. The plurality of first touch electrode channels may be electrodes for transmitting a touch signal or touch TX electrodes, and the plurality of second touch electrodes may be electrodes for receiving a touch signal or touch RX electrodes, but are not limited by the term.

The touch electrode part according to an example embodiment of the present disclosure may be implemented by a touch panel including a plurality of touch electrodes. For example, when the light emitting structure has a top emission structure, an add-on type touch panel may be disposed or coupled onto the encapsulation part or an optical film, and when the light emitting structure has a bottom emission structure, the touch panel may be disposed or coupled (or connected) to a rear surface of the substrate.

A touch electrode part according to another example embodiment of the present disclosure may be directly formed on the encapsulation part according to the in-cell manner. For example, when the light emitting structure has a top emission structure, the in-cell type touch electrode part may be directly formed on a front surface of the encapsulation part, but example embodiments of the present disclosure are not limited thereto.

The touch part according to an example embodiment of the present disclosure may further include a second connection electrode.

For example, the second connection electrode may be disposed on different planes from the plurality of touch electrodes so as not to be electrically connected and electrically connect the plurality of touch electrodes to each other. The second connection electrode may be a touch electrode connection line, a touch bridge electrode, or a touch bridge line, but is not limited by the term.

For example, the second connection electrode may be disposed between the plurality of first touch electrodes adjacent in the first direction (or the X-axis direction). The second connection electrode is spaced apart in the first direction (or the X-axis direction) to electrically connect the plurality of first touch electrodes which is connected to the plurality of first touch electrodes disposed to be adjacent, but example embodiments of the present disclosure are not limited thereto.

The first touch electrode and the second touch electrode may be disposed to be spaced apart from each other with a predetermined interval. At least one or more first touch electrodes which is adjacent in the first direction (or the X-axis direction) may be formed to be spaced apart from each other. Each of at least one or more first touch electrodes adjacent in the first direction (or the X-axis direction) may be connected to the second connection electrode. For example, each first touch electrode may be connected to the second connection electrode through a hole of the insulating layer.

The second touch electrode adjacent in the second direction (or the Y-axis direction) may be connected by the third connection electrode. The third connection electrode may be a touch electrode connection line, a touch bridge electrode, or a touch bridge line, but is not limited by the term.

The passivation layer may be formed on the first touch electrode and the second touch electrode. The passivation layer may be disposed so as to cover the insulating layer, the first touch electrode and the second touch electrode. The passivation layer may be formed of at least one or more materials such as benzocyclobutene (BCB), acrylic resin, epoxy resin, phenolic resin, polyamide resin, and polyimide resin, but example embodiments of the present disclosure are not limited thereto. The passivation layer may be a protection layer, a planarization layer or an insulating layer, but is not limited by the term.

To apply an electric signal to the touch electrode part of the touch part in the display area AA, touch lines may be disposed on the non-display area NA. The touch line may be a touch connection line or a touch routing line, but is not limited by the term.

The touch driving circuit may receive a touch sensing signal from the first touch electrode. The touch driving circuit may transmit a touch driving signal from the second touch electrode. The touch driving circuit may sense the user's touch by a mutual capacitance between the first touch electrode connected to the plurality of first touch electrodes and the second touch electrode connected to the second touch electrode. For example, when the touch operation is performed on the display apparatus 1000, a capacitance between the first touch electrode and the second touch electrode may be changed. The touch driving circuit may sense the capacitance change to detect a touch coordinate.

According to another example embodiment of the present disclosure, the color filter 214 may be disposed on the touch part, but example embodiments of the present disclosure are not limited thereto. A black matrix may be further disposed between the color filters 214. According to another example embodiment of the present disclosure, the color filter 214 may be disposed on the touch part and the encapsulation part, but example embodiments of the present disclosure are not limited thereto. A black matrix may be further disposed between the color filters 214.

Figure 5:
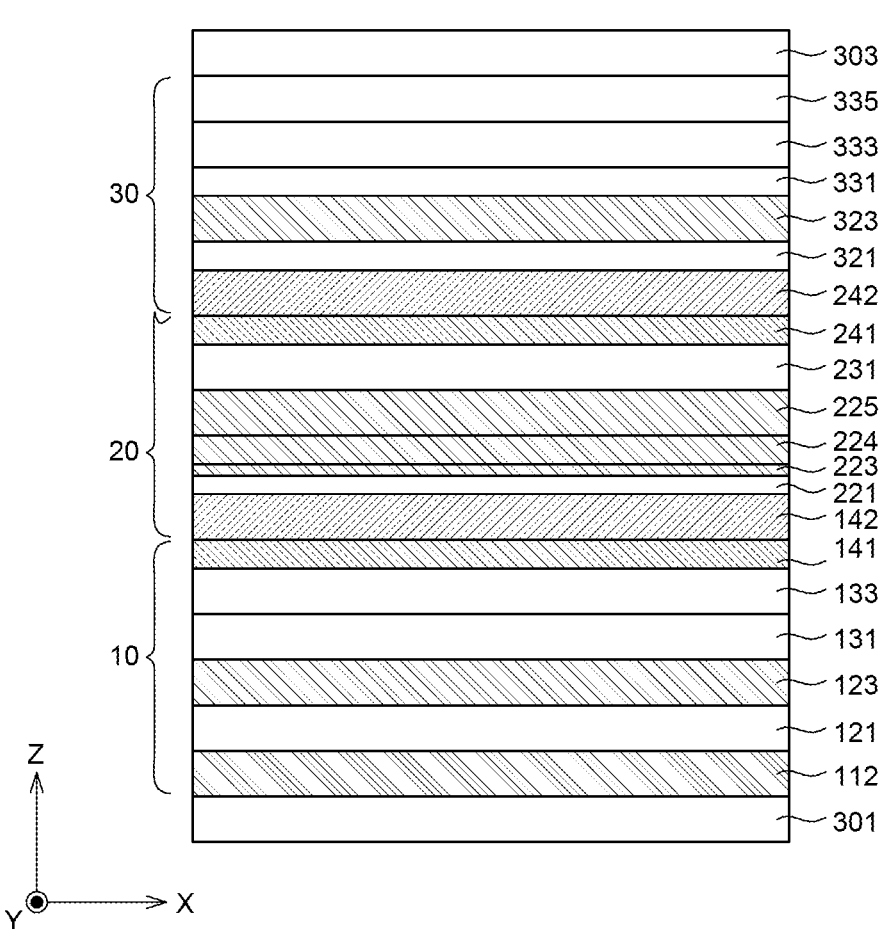
FIG. 5 illustrates a light emitting structure of a display apparatus according to an example embodiment of the present disclosure.

FIG. 5 illustrates a light emitting structure according to an example embodiment of the present disclosure.

Referring to FIG. 5, a light emitting structure 300 according to an example embodiment of the present disclosure may be disposed on a cathode electrode 301 (or an anode electrode 301). For example, the light emitting structure 300 may include at least one or more emission parts 10, 20, and 30. For example, at least one or more emission parts 10, 20, and 30 may include a first emission part 10, a second emission part 20, and a third emission part 30.

The first emission part 10, the second emission part 20, and the third emission part 30 may be disposed between the cathode electrode 301 and the anode electrode 303. The cathode electrode 301 may be disposed to be closer to the substrate 101 than the anode electrode 303.

According to an example embodiment of the present disclosure, the light emitting structure 300 which is supplied with electrons from the cathode electrode 301 and supplied with holes from the anode electrode 303 may be configured.

According to another example embodiment of the present disclosure, a buffer layer may be further configured on the substrate 101. The buffer layer may include at least one or more layers, but example embodiments of the present disclosure are not limited thereto. The first buffer layer may include silicon oxide (SiOx), but example embodiments of the present disclosure are not limited thereto. For example, the first buffer layer may include laminating silicon oxide (SiOx) and silicon nitride (SiNx) in a plurality of layers, but example embodiments of the present disclosure are not limited thereto. For example, the first buffer layer may include laminating silicon oxide (SiOx) and silicon nitride (SiNx), but example embodiments of the present disclosure are not limited thereto.

The cathode electrode 301 may be a negative electrode which supplies electrons. The cathode electrode 301 may be configured with a transparent conductive material such as transparent conductive oxide (TCO). For example, the cathode electrode 301 may include indium tin oxide (ITO), indium zinc oxide (IZO), and indium gallium zinc oxide (IGZO), or include a single layer or a plurality of layers thereof, but example embodiments of the present disclosure are not limited thereto.

As another example embodiment of the present disclosure, the cathode electrode 301 may include gold (Au), silver (Ag), aluminum (Al), molybdenum (Mo), magnesium (Mg), lithium (Li), calcium (Ca), lithium fluoride (LiF), and silver-magnesium (Ag:Mg), but example embodiments of the present disclosure are not limited thereto. As another example embodiment of the present disclosure, a reflective electrode is further configured in the cathode electrode 301 to reflect the light toward the anode electrode 303.

The anode electrode 303 may be a positive electrode which supplies holes. The anode electrode 303 may include gold (Au), silver (Ag), aluminum (Al), molybdenum (Mo), magnesium (Mg), lithium (Li), calcium (Ca), lithium fluoride (LiF), silver-magnesium (Ag:Mg), indium tin oxide (ITO), and indium zinc oxide (IZO), or an alloy thereof, but example embodiments of the present disclosure are not limited thereto. Further, the anode electrode may include a single layer or a plurality of layers thereof. As another example embodiment of the present disclosure, the anode electrode 303 may include a transparent conductive material such as transparent conductive oxide (TCO). For example, the anode electrode 303 may include indium tin oxide (ITO) and indium zinc oxide (IZO), but example embodiments of the present disclosure are not limited thereto.

For example, the cathode electrode 301 may be configured as a transmissive electrode and the anode electrode 303 may be configured as a transflective electrode or a partially transmissive electrode. According to another example embodiment of the present disclosure, the cathode electrode 301 may be configured as a reflective electrode and the anode electrode 303 may be configured as a transflective electrode or a partially transmissive electrode. According to another example embodiment of the present disclosure, the cathode electrode 301 may be configured as a transflective electrode or a partially transmissive electrode and the anode electrode 303 may be configured as a transmissive electrode. According to another example embodiment of the present disclosure, at least one of the cathode electrode 301 and the anode electrode 303 may be configured as one of a transflective electrode, a partially transmissive electrode, and a reflective electrode.

The first emission part 10 may be disposed on the cathode electrode 301. The first emission part 10 may include a first electron transport layer 121, a first emission layer 123, and a first hole transport layer 131.

The first emission layer 123 may be an emission layer which emits first color light. For example, the first emission layer 123 may include one of a blue emission layer, a deep blue emission layer, and a sky blue emission layer. An emission area of the first emission layer 123 may be a wavelength region in the range of 420 nm to 480 nm. For example, a thickness of the first emission layer 123 may be 20 nm or more to 40 nm or less, but example embodiments of the present disclosure are not limited thereto. In the description herein a thickness of a layer or structure in FIG. 5 refers to a dimension of the layer or structure in the Z direction shown in FIG. 5, for descriptive purposes.

The first emission layer 123 may include a blue emission layer and further includes an auxiliary emission layer which may emit another color light. For example, the auxiliary emission layer may include one or more of a yellow-green emission layer, a green emission layer, and a red emission layer, or a combination thereof. When the auxiliary emission layer is further included, a green or red efficiency may be further improved. When the first emission layer 123 is configured to include the auxiliary emission layer, a yellow-green emission layer, or a red emission layer, or a green emission layer may be configured on or below the blue emission layer. As another example embodiment of the present disclosure, as the auxiliary emission layer, the yellow-green emission layer, the green emission layer, or the red emission layer may be configured on and below the blue emission layer with the same configuration or with different configurations. A position or the number of emission layers may be disposed in accordance with the configuration and the characteristic of the light emitting structure, but example embodiments of the present disclosure are not limited thereto.

When the yellow-green emission layer which is an auxiliary emission layer is configured in the first emission layer 123, the emission area of the first emission layer 123 may be a wavelength region in the range of 420 nm to 590 nm. When the red emission layer which is an auxiliary emission layer is configured in the first emission layer 123, the emission area of the first emission layer 123 may be a wavelength region in the range of 420 nm to 650 nm. When the yellow-green emission layer and the red emission layer which are auxiliary emission layers are configured in the first emission layer 123, the emission area of the first emission layer 123 may be a wavelength region in the range of 420 nm to 650 nm. When the yellow-green emission layer and the green emission layer which are auxiliary emission layers are configured in the first emission layer 123, the emission area of the first emission layer 123 may be a wavelength region in the range of 420 nm to 590 nm. Accordingly, the first emission layer 123 includes one of the blue emission layer, the deep blue emission layer, and the sky blue emission layer and the yellow-green emission layer. Alternatively, the first emission layer 123 includes one of the blue emission layer, the deep blue emission layer, and the sky blue emission layer and the red emission layer. Alternatively, the first emission layer 123 includes one of the blue emission layer, the deep blue emission layer, and the sky blue emission layer and the yellow-green emission layer and the red emission layer. Alternatively, the first emission layer 123 includes one of the blue emission layer, the deep blue emission layer, and the sky blue emission layer and the yellow-green emission layer, the red emission layer, and the green emission layer, or may include a combination thereof. However, example embodiments of the present disclosure are not limited thereto.

According to another example embodiment of the present disclosure, the first emission layer 123 may include two or more emission layers which emit the same color light. For example, the first emission layer 123 may include two or more blue emission layers. The first emission layer 123 including two or more blue emission layers may include layers having different thicknesses from each other, but example embodiments of the present disclosure are not limited thereto.

The first emission layer 123 may include at least one host and dopant, but example embodiments of the present disclosure are not limited thereto. As another example embodiment of the present disclosure, the first emission layer 123 may include a mixed host in which two or more hosts are mixed and at least one dopant. For example, the mixed host may include a host having a hole transport characteristic and a host having an electron transport characteristic. When the first emission layer includes the mixed host, a charge balance of the emission layer may be controlled to improve the efficiency of the first emission layer 123. For example, the dopant may be a fluorescent dopant or a phosphorescent dopant, but example embodiments of the present disclosure are not limited thereto.

The first electron transport layer 121 may be disposed on the cathode electrode 301. The first electron transport layer 121 may include two or more layers or two or more materials, but the example embodiments of the present disclosure are limited thereto. An electron injection layer may be further configured on the first electron transport layer 121. For example, the first electron transport layer 121 may be disposed to be adjacent to the cathode electrode 301.

The first electron transport layer 121 may supply electrons received from the cathode electrode 301 to the first emission layer 123. The holes from the first hole transport layer 131 may be supplied to the first emission layer 123. Thus, in the first emission layer 123, electrons supplied from the first electron transport layer 121 and holes supplied from the first hole transport layer 131 are recombined to generate light.

According to an example embodiment of the present disclosure, the first hole transport layer 131 may include two or more layers or two or more materials, but the example embodiments of the present disclosure are limited thereto. For example, the second hole transport layer 133 may be further included on the first hole transport layer 131. The second hole transport layer 133 may more smoothly inject the holes into the first emission layer 123. Thus, the efficiency of the first emission layer 123 may be further improved. For example, the first hole transport layer 131 and the second hole transport layer 133 may be first hole transport layers, but example embodiments of the present disclosure are not limited thereto.

According to another example embodiment of the present disclosure, a hole injection layer may be further configured below the first hole transport layer 131. The hole injection layer may smoothly inject holes from the first hole transport layer 131 into the first emission layer 123.

According to another example embodiment of the present disclosure, a hole blocking layer may be further configured below the first emission layer 123. The hole blocking layer suppresses the hole injected into the first emission layer 123 from passing over the first electron transport layer 121 to improve the combining of the holes and the electrons in the first emission layer 123, thereby improving a luminous efficiency of the first emission layer 123. The first electron transport layer 121 and the hole blocking layer may be configured as one layer, but example embodiments of the present disclosure are not limited thereto.

According to another example embodiment of the present disclosure, an electron blocking layer may be further configured on the first emission layer 123. The electron blocking layer suppresses the electrons injected into the first emission layer 123 from passing over the first hole transport layer 131 to improve the combining of the holes and the electrons in the first emission layer 123, thereby improving the luminous efficiency of the first emission layer 123. The first hole transport layer 131 and the electron blocking layer may be configured as one layer, but example embodiments of the present disclosure are not limited thereto.

When the cathode electrode 301 is indium tin oxide (ITO), a work function of the ITO may be 4.7 eV to 5 eV. A low unoccupied molecular orbital (LUMO) of the first electron transport layer 121 may be 2.7 eV to 3.2 eV. It was recognized that the injection of the electrons into the emission layer is not sufficient due to an energy barrier of the ITO and the first electron transport layer 121. When the electron transport layer is configured on the cathode electrode 301 to inject the electrons, the injection of the electrons into the emission layer may be difficult due to the energy barrier between the ITO which is the cathode electrode 301 and the electron transport layer. In the display apparatus in which the light emitting structure is configured on the cathode electrode 301, the electron transport layer in which an electron mobility is slow is configured to be thick, so that the electron injection is insufficient. Accordingly, the inventors of the present disclosure conducted extensive research and experiments to smoothly inject electrons into the emission layer. The first charge generation layer 112 is further configured on the cathode electrode 301 through extensive research and experiments.

According to an example embodiment of the present disclosure, a first charge generation layer 112 may be further included on the cathode electrode 301. For example, the first charge generation layer 112 may be disposed between the cathode electrode 301 and the first electron transport layer 121. The first charge generation layer 112 may be an n-type charge generation layer. The n-type charge generation layer may inject electrons into the first emission part 10. For example, the n-type charge generation layer may inject electrons into the first emission layer 123. For example, the first n-type charge generating layer may be formed of an organic layer doped with an alkali metal such as lithium (Li), sodium (Na), potassium (K), or cesium (Cs) or an alkali earth metal such as magnesium (Mg), strontium (Sr), barium (Ba), or radium (Ra), but example embodiments of the present disclosure are not limited thereto. The first charge generation layer 112 is further configured in the first emission part 10 so that the electrons may be more smoothly transferred to the first emission layer 123 together with the first electron transport layer 121. Thus, the efficiency of the first emission layer 123 may be further improved. For example, the first charge generation layer 112 may be a fifth charge generation layer, but example embodiments of the present disclosure are not limited thereto. For example, the first charge generation layer 112 may be disposed to be adjacent to the cathode electrode 301.

According to an example embodiment of the present disclosure, a second charge generation layer 141 may be further included on the second hole transport layer 133. The second charge generation layer 141 may be a p-type charge generation layer. The p-type charge generation layer may inject holes into the first emission part 10. The p-type charge generation layer may include an organic layer including a p-type dopant, but example embodiments of the present disclosure are not limited thereto. For example, the second charge generation layer 141 may be the first charge generation layer, but example embodiments of the present disclosure are not limited thereto.

According to another example embodiment of the present disclosure, a charge generation layer may be included between the first emission part 10 and the second emission part 20. For example, the charge generation layer may control a charge balance between the first emission part 10 and the second emission part 20. For example, the charge generation layer may include the second charge generation layer 141 and the third charge generation layer 142. For example, the second charge generation layer 141 is a p-type charge generation layer and the third charge generation layer 142 may be an n-type charge generation layer. For example, the second charge generation layer 141 may include a PN junction. The second charge generation layer 141 is included in the first emission part 10 and the third charge generation layer 142 may be included in the second emission part 20, but the example embodiments of the present disclosure are not limited thereto. The second charge generation layer 141 and the third charge generation layer 142 may be included in the first emission part 10, but the example embodiments of the present disclosure are not limited thereto. For example, the third charge generation layer 142 may be included in the second emission part 20, but the exemplary embodiments of the present disclosure are not limited thereto. For example, the third charge generation layer 142 may be the second charge generation layer in the first emission part 10, but example embodiments of the present disclosure are not limited thereto.

The first emission part 10 according to an example embodiment of the present disclosure may include at least one or more layers between the cathode electrode 301 and the third charge generation layer 142. At least one or more layers may be an organic layer. For example, the first emission part 10 may include an organic layer between the cathode electrode 301 and the n-type charge generation layer which is a third charge generation layer 142. For example, the organic layer may include at least one or more of the charge generation layer, the electron transport layer, the emission layer, and the hole transport layer. For example, the organic layer may include at least one or more of the first charge generation layer 112, the first electron transport layer 121, the first emission layer 123, and one or more hole transport layers 131 and 133.

The second emission part 20 according to an example embodiment of the present disclosure may include a second electron transport layer 221, at least one or more of emission layers 223, 224, and 225, and a third hole transport layer 231. For example, the second emission part 20 may include two or more emission layers 223, 224, and 225.

The second emission layer 223 may emit light having a color which is different from the first color. For example, the second emission layer 223 may be an emission layer which emits second color light. For example, the second emission layer 223 may emit red light. An emission area of the second emission layer 223 may be a wavelength region in the range of 600 nm to 650 nm.

The third emission layer 224 may emit light having a color which is different from the first color. For example, the third emission layer 224 may emit light having a color which is different from the first color and/or the second color. For example, the third emission layer 224 may be an emission layer which emits third color light. For example, the third emission layer 224 may emit yellow light. An emission area of the third emission layer 224 may be a wavelength region in the range of 520 nm to 590 nm.

According to another example embodiment of the present disclosure, the third emission layer 224 may emit green light. An emission area of the third emission layer 224 may be a wavelength region in the range of 510 nm to 570 nm.

The fourth emission layer 225 may emit light having a color which is different from the first color. For example, the third emission layer 224 may emit light having a color which is different from at least one of the first color, the second color, and the third color. The fourth emission layer 225 may be an emission layer which emits fourth color light. For example, the fourth emission layer 225 may emit green light. An emission area of the fourth emission layer 225 may be a wavelength region in the range of 510 nm to 570 nm.

According to an example embodiment of the present disclosure, the third emission layer 224 may include one or more of the yellow-green emission layer and the green emission layer. According to an example embodiment of the present disclosure, the fourth emission layer 225 may include one or more of the yellow-green emission layer and the green emission layer.

The emission area of the emission layer of the second emission part 20 according to an example embodiment of the present disclosure may be a wavelength region of the range of 510 nm to 650 nm.

The second emission layer 223 may be disposed to be closer to the cathode electrode 301 than the third emission layer 224. In some implementations, the red emission layer which is the second emission layer 223 is configured to be closer to the cathode electrode 301 than the yellow-green emission layer which is the third emission layer 224 so that the light is emitted in a wavelength of 600 nm to 650 nm corresponding to the red emission layer, to further improve the red efficiency. According to an example embodiment of the present disclosure, the second emission part 20 configures the second emission layer 223 and the fourth emission layer 225 so that the green or red efficiency may be further improved.

The second emission layer 223 may be configured to be adjacent to the third emission layer 224. For example, the red emission layer which is the second emission layer 223 may be configured to be adjacent to the yellow-green emission layer which is the third emission layer 224. The yellow-green emission layer may implement both red and green, so that the red efficiency or the red lifespan may be degraded. Therefore, the yellow-green emission layer and the red emission layer are configured to be adjacent to one another to improve the red efficiency or the red lifespan.

The third emission layer 224 may be configured to be adjacent to the fourth emission layer 225. For example, the yellow-green emission layer which is the third emission layer 224 may be configured to be adjacent to the green emission layer which is the fourth emission layer 225. Thus, the yellow-green emission layer which is the third emission layer 224 may further improve the efficiency and/or lifespan of the green emission layer which is the fourth emission layer 225 including the phosphorescent material.

As another example embodiment of the present disclosure, the emission layer of the second emission part 20 may include two emission layers. For example, the emission layer of the second emission part 20 may include the red emission layer and the yellow-green emission layer. For example, in the emission layer of the second emission part 20, the yellow-green emission layer may be configured on the red emission layer. An emission area of the yellow-green emission layer may be a wavelength region in the range of 520 nm to 590 nm. For example, the emission area of the emission layer of the second emission part 20 may be a wavelength region of the range of 520 nm to 650 nm.

As another example embodiment of the present disclosure, the emission layer of the second emission part 20 may include two emission layers. For example, the emission layer of the second emission part 20 may include the red emission layer and the green emission layer. For example, in the emission layer of the second emission part 20, the green emission layer may be configured on the red emission layer. An emission area of the green emission layer may be a wavelength region in the range of 510 nm to 570 nm. For example, the emission area of the emission layer of the second emission part 20 may be a wavelength region of the range of 510 nm to 650 nm.

As another example embodiment of the present disclosure, the emission layer of the second emission part 20 may include two emission layers. For example, the emission layer of the second emission part 20 may include the red emission layer and the yellow emission layer. For example, in the emission layer of the second emission part 20, the yellow emission layer may be configured on the red emission layer. An emission area of the yellow emission layer may be a wavelength region in the range of 560 nm to 590 nm. For example, the emission area of the emission layer of the second emission part 20 may be a wavelength region of the range of 560 nm to 650 nm.

A position or the number of emission layers of the second emission part 20 may be disposed in accordance with the configuration and the characteristic of the light emitting structure, but example embodiments of the present disclosure are not limited thereto.

The second emission layer 223 may include at least one host and dopant, but example embodiments of the present disclosure are not limited thereto. As another example embodiment of the present disclosure, the second emission layer 223 may include a mixed host in which two or more hosts are mixed and at least one dopant. For example, the mixed host may include a host having a hole transport characteristic and a host having an electron transport characteristic. When the mixed host is configured, a charge balance of the second emission layer 223 may be controlled or adjusted to improve the efficiency of the second emission layer 223. For example, the dopant may be a fluorescent dopant or a phosphorescent dopant, but example embodiments of the present disclosure are not limited thereto.

The third emission layer 224 may include at least one host and dopant, but example embodiments of the present disclosure are not limited thereto. As another example embodiment of the present disclosure, the third emission layer 224 may include a mixed host in which two or more hosts are mixed and at least one dopant. For example, the mixed host may include a host having a hole transport characteristic and a host having an electron transport characteristic. When the mixed host is configured, a charge balance of the third emission layer 224 may be controlled or adjusted to improve the efficiency of the third emission layer 224. For example, the dopant may be a fluorescent dopant or a phosphorescent dopant, but example embodiments of the present disclosure are not limited thereto.

The fourth emission layer 225 may include at least one host and dopant, but example embodiments of the present disclosure are not limited thereto. As another example embodiment of the present disclosure, the fourth emission layer 225 may include a mixed host in which two or more hosts are mixed and at least one dopant. For example, the mixed host may include a host having a hole transport characteristic and a host having an electron transport characteristic. When the mixed host is configured, a charge balance of the fourth emission layer 225 may be controlled or adjusted to improve the efficiency of the fourth emission layer 225. For example, the dopant may be a fluorescent dopant or a phosphorescent dopant, but example embodiments of the present disclosure are not limited thereto. For example, the second emission layer 223, the third emission layer 224, and the fourth emission layer 225 may be one second emission layer, but example embodiments of the present disclosure are not limited thereto.

According to an example embodiment of the present disclosure, the second emission layer 223 is a red emission layer, the third emission layer 224 is a yellow-green emission layer, and the fourth emission layer 225 may be a green emission layer. In this case, a sum of thicknesses of the second emission layer 223, the third emission layer 224, and the fourth emission layer 225 may be 40 nm or more to 55 nm or less, but example embodiments of the present disclosure are not limited thereto. For example, a thickness of the second emission layer 223 is smaller than a thickness s of the third emission layer 224. For example, a thickness of the second emission layer 223 is smaller than a thickness of the fourth emission layer 225. For example, a thickness of the third emission layer 224 is smaller than a thickness of the fourth emission layer 225. For example, a thickness of the second emission layer 223 is smaller than a thickness of the fourth emission layer 225. For example, a thickness of the second emission layer 223 may be 8 nm or more to 12 nm or less, but example embodiments of the present disclosure are not limited thereto. For example, a thickness of the third emission layer 224 may be 12 nm or more to 18 nm or less, but example embodiments of the present disclosure are not limited thereto. For example, a thickness of the fourth emission layer 225 may be 20 nm or more to 25 nm or less, but example embodiments of the present disclosure are not limited thereto.

The third charge generation layer 142 may be disposed on the second charge generation layer 141. The second electron transport layer 221 may be disposed on the third charge generation layer 142. For example, the second electron transport layer 221 may be disposed between the third charge generation layer 142 and the second emission layer 223. For example, the third charge generation layer 142 may be disposed between the second charge generation layer 141 and the second electron transport layer 221.

The second electron transport layer 221 may supply electrons received from the third electrode 142 to the second to fourth emission layers 223, 224, and 225. The holes from the third hole transport layer 231 may be supplied to the second to fourth emission layers 223, 224, and 225. Thus, in the second to fourth emission layers 223, 224, and 225, electrons supplied from the second electron generation layer 221 and holes supplied from the third hole transport layer 231 are recombined to generate light.

According to an example embodiment of the present disclosure, the third hole transport layer 231 may include two or more layers or two or more materials, but the example embodiments of the present disclosure are limited thereto. For example, the third hole transport layer 231 may be disposed on the fifth emission layer 225. For example, the third hole transport layer 231 may be the second hole transport layer, but example embodiments of the present disclosure are not limited thereto.

According to an example embodiment of the present disclosure, the fourth charge generation layer 241 may be disposed on the third hole transport layer 231. For example, the fourth charge generation layer 241 may be a p-type charge generation layer. For example, the fourth charge generation layer 241 may be the third charge generation layer, but example embodiments of the present disclosure are not limited thereto.

The second emission part 20 according to an example embodiment of the present disclosure may include at least one or more layers between the second charge generation layer 141 and the fifth charge generation layer 242. At least one or more layers may be organic layers. For example, the second emission part 20 may include an organic layer between the p-type charge generation layer which is the second charge generation layer 141 and the n-type charge generation layer which is the fifth charge generation layer 242. For example, the organic layer may include at least one or more of the charge generation layer, the electron transport layer, the emission layer, and the hole transport layer. For example, the organic layer may include at least one or more of the third charge generation layer 142, the second electron transport layer 221, one or more emission layers 223, 224, and 225, the third hole transport layer 231, and the fourth charge generation layer 241.

The third emission part 30 according to an example embodiment of the present disclosure may include a third electron transport layer 321, the fifth emission layer 323, and hole transport layers 331 and 333.

The fifth emission layer 323 may be an emission layer which emits first color. For example, the fifth emission layer 323 may include one of a blue emission layer, a deep blue emission layer, and a sky blue emission layer. An emission area of the fifth emission layer 323 may be a wavelength region in the range of 420 nm to 480 nm. For example, the fifth emission layer 323 may be the third emission layer, but example embodiments of the present disclosure are not limited thereto. For example, the thickness of the fifth emission layer 323 may be 20 nm or more to 40 nm or less, but example embodiments of the present disclosure are not limited thereto.

The fifth emission layer 323 may include a blue emission layer further including an auxiliary emission layer which may emit another color. For example, the auxiliary emission layer may include one or more of a yellow-green emission layer, a green emission layer, and a red emission layer, or a combination thereof. When the auxiliary emission layer is further configured, a green or red efficiency may be further improved. When the fifth emission layer 323 is configured to include the auxiliary emission layer, a yellow-green emission layer, or a red emission layer, or a green emission layer may be possibly configured on or below the blue emission layer. As another example embodiment of the present disclosure, as the auxiliary emission layer, the yellow-green emission layer, the green emission layer, or the red emission layer may be configured on and below the blue emission layer with the same configuration or with different configurations. A position or the number of emission layers may be disposed in accordance with the configuration and the characteristic of the light emitting structure, but example embodiments of the present disclosure are not limited thereto.

When the yellow-green emission layer is configured in the fifth emission layer 323, the emission area of the fifth emission layer 323 may be a wavelength region in the range of 420 nm to 590 nm. When the red emission layer is configured in the fifth emission layer 323, the emission area of the fifth emission layer 323 may be a wavelength region in the range of 420 nm to 650 nm. When the yellow-green emission layer and the red emission layer which are auxiliary emission layers are configured in the fifth emission layer 323, the emission area of the fifth emission layer 323 may be a wavelength region in the range of 420 nm to 650 nm. When the yellow-green emission layer and the green emission layer which are auxiliary emission layers are configured in the fifth emission layer 323, the emission area of the fifth emission layer 323 may be a wavelength region in the range of 420 nm to 590 nm. Accordingly, the fifth emission layer 323 includes one of the blue emission layer, the deep blue emission layer, and the sky blue emission layer and the yellow-green emission layer, or includes one of the blue emission layer, the deep blue emission layer, and the sky blue emission layer and the red emission layer, includes one of the blue emission layer, the deep blue emission layer, and the sky blue emission layer, the yellow-green emission layer, and the red emission layer, or includes one of the blue emission layer, the deep blue emission layer, and the sky blue emission layer, the yellow-green emission layer, the red emission layer, and the green emission layer, or may include a combination thereof. However, example embodiments of the present disclosure are not limited thereto.

According to another example embodiment of the present disclosure, the fifth emission layer 323 may include two or more emission layers which emit the same color light. For example, the fifth emission layer 323 may include two or more blue emission layers. The fifth emission layer 323 including two or more blue emission layers may include layers having different thicknesses or the same thickness from each other, but example embodiments of the present disclosure are not limited thereto.

The fifth emission layer 323 may include at least one host and dopant, but example embodiments of the present disclosure are not limited thereto. As another example embodiment of the present disclosure, the fifth emission layer 323 may include a mixed host in which two or more hosts are mixed and at least one dopant. For example, the mixed host may include a host having a hole transport characteristic and a host having an electron transport characteristic. When the mixed host is configured, a charge balance of the emission layer may be controlled or adjusted to improve the efficiency of the fifth emission layer 323. For example, the dopant may include a fluorescent dopant or a phosphorescent dopant, but example embodiments of the present disclosure are not limited thereto.

The fifth charge generation layer 242 may be disposed on the fourth charge generation layer 241. For example, the fourth charge generation layer 241 may be a p-type charge generation layer. For example, the fifth charge generation layer 242 may be the fourth charge generation layer, but example embodiments of the present disclosure are not limited thereto.

The third electron transport layer 321 may be disposed on the fifth charge generation layer 242. For example, the third electron transport layer 321 may be disposed between the fifth charge generation layer 242 and the fifth emission layer 323. For example, the fifth charge generation layer 242 may be disposed between the fourth charge generation layer 241 and the third electron transport layer 321.

The third electron transport layer 321 may include two or more layers or two or more materials, but example embodiments of the present disclosure are limited thereto. An electron injection layer may be further configured on the third electron transport layer 321.

According to another example embodiment of the present disclosure, at least one or more of the first hole transport layer, the second hole transport layer, and the third hole transport layer includes two or more hole transport layers. Among two or more hole transport layers of the third hole transport layer, a thickness of the fourth hole transport layer 331 adjacent to the fifth emission layer 323 may be smaller than a thickness of the fifth hole transport layer 333 adjacent to the anode electrode 303. For example, the thickness of the fourth hole transport layer 331 may be 5 nm or more to 15 nm or less, but example embodiments of the present disclosure are not limited thereto. For example, the thickness of the fifth hole transport layer 333 may be 35 nm or more to 45 nm or less, but example embodiments of the present disclosure are not limited thereto.

According to an example embodiment of the present disclosure, the fourth hole transport layer 331 may include two or more layers or two or more materials, but example embodiments of the present disclosure are limited thereto. For example, the fifth hole transport layer 333 may be further included on the fourth hole transport layer 331. The fifth hole transport layer 333 may more smoothly inject the holes into the fifth emission layer 323. Thus, the efficiency of the fifth emission layer 323 may be further improved. For example, the fourth hole transport layer 331 and the fifth hole transport layer 333 may be third hole transport layers, but example embodiments of the present disclosure are not limited thereto. For example, the third hole transport layer may be disposed to be adjacent to the anode electrode 303.

The third electron transport layer 321 may supply electrons received from the fifth charge generation layer 242 to the fifth emission layer 323. The holes from the fourth hole transport layer 331 may be supplied to the fifth emission layer 323. Thus, in the fifth emission layer 323, electrons supplied from the third electron transport layer 321 and holes supplied from the fourth hole transport layer 331 and the fifth hole transport layer 333 are recombined to generate light.

According to another example embodiment of the present disclosure, a hole injection layer may be further configured below the fourth hole transport layer 331. The hole injection layer may smoothly inject holes from the fourth hole transport layer 331 into the fifth emission layer 323.

According to another example embodiment of the present disclosure, a hole blocking layer may be further configured below the fifth emission layer 323. The hole blocking layer suppresses the hole injected into the fifth emission layer 323 from passing over the third electron transport layer 321 to improve the combining of the holes and the electrons in the fifth emission layer 323, thereby improving the luminous efficiency of the fifth emission layer 323. The third electron transport layer 321 and the hole blocking layer may be configured as one layer, but example embodiments of the present disclosure are not limited thereto.

According to another example embodiment of the present disclosure, an electron blocking layer may be further configured on the fifth emission layer 323. The electron blocking layer suppresses the electrons injected into the fifth emission layer 323 from passing over the fourth hole transport layer 331 to improve the combining of the holes and the electrons in the fifth emission layer 323, thereby improving the luminous efficiency of the fifth emission layer 323. The fourth hole transport layer 331 and the electron blocking layer may be configured as one layer, but example embodiments of the present disclosure are not limited thereto.

According to another example embodiment of the present disclosure, the fourth hole transport layer 331 may be an electron blocking layer. The fourth hole transport layer 331 may include a material whose hole mobility is slower than that of the fifth hole transport layer 333. Thus, the hole of the fifth hole transport layer 333 may be well transferred to the fifth emission layer 323.

The hole injection layer 335 may be disposed on the fifth hole transport layer 333. The hole injection layer 335 may smoothly inject holes from the anode electrode 303 into the fifth emission layer 323. Thus, the efficiency of the fifth emission layer 323 may be further improved. The anode electrode 303 may be disposed on the hole injection layer 335.

The third emission part 30 according to an example embodiment of the present disclosure includes at least one or more layers between the fourth charge generation layer 241 and the anode electrode 303. At least one or more layers may be an organic layer. For example, the third emission layer 30 may include an organic layer between the p-type charge generation layer which is the fourth charge generation layer 241 and the anode electrode 303. For example, the organic layer may include at least one or more of the charge generation layer, the electron transport layer, the emission layer, and the hole transport layer. For example, the organic layer may include at least one or more of the fifth charge generation layer 242, the third electron transport layer 321, the fifth emission layer 323, and one or more hole transport layers 331 and 333.

According to another example embodiment of the present disclosure, an emission layer of at least one or more of the first emission part 10 to the third emission part 30 may include an emission layer which emits the same color. For example, the emission layers of the first emission part 10 and the third emission part 30 may include the emission layers which emit the same color light. For example, the emission layer of the first emission part 10 and the emission layer of the third emission part 30 may include the emission layers which emit blue light. As another example embodiment of the present disclosure, the emission layer of the first emission part 10 and the emission layer of the third emission part 30 may include two or more blue emission layers. As another example embodiment of the present disclosure, the emission layer of the first emission part and the emission layer of the third emission part 30 may include two or more blue emission layers and two or more layers may be configured to have the same thickness or different thicknesses. The emission layer of the second emission part 20 may include the emission layers which emit different color light from the emission layers of the first emission part 10 and the third emission part 30. For example, the emission layer of the second emission part 20 may include at least one or more emission layers described in FIG. 5, but example embodiments of the present disclosure are not limited thereto.

According to another example embodiment of the present disclosure, emission layers of the first emission part 10 and the second emission part 20 may include emission layers which emit the same color light. For example, the emission layer of the first emission part 10 and the emission layer of the second emission part 20 may include the emission layers which emit blue light. As another example embodiment of the present disclosure, the emission layer of the first emission part and the emission layer of the second emission part 20 may include two or more blue emission layers. As another example embodiment of the present disclosure, the emission layer of the first emission part 10 and the emission layer of the second emission part 20 may include two or more blue emission layers and two or more layers may be configured to have the same thickness or different thicknesses. The emission layer of the third emission part 30 may include the emission layers which emit different color light from the emission layers of the first emission part 10 and the second emission part 20. For example, the emission layer of the third emission part 30 may include at least one or more of the red emission layers, the yellow-green emission layer, and the green emission layer, but example embodiments of the present disclosure are not limited thereto. For example, the emission layer of the third emission part 30 may include at least one or more of emission layers of the second emission part 20 described in FIG. 5, but example embodiments of the present disclosure are not limited thereto.

According to an example embodiment of the present disclosure, when the emission parts are disposed on the cathode electrode 301 (for example, a first structure or a reverse structure), a thickness of the hole transport layer is thinner than that the case in which the emission parts are disposed on the anode electrode 303 (for example, the second structure). Further, the thickness of the electron transport layer may be configured to be thick. The electron mobility is slower than the hole mobility so that when the thickness of the electron transport layer is thick, the electron mobility is low so that there is a problem in that a driving voltage increases. Therefore, the inventors of the present disclosure conducted extensive research and experiments to lower the driving voltage and improve the efficiency and/or a viewing angle characteristic. The inventors invented a new display apparatus which lowered a driving voltage and improved an efficiency and/or a viewing angle characteristic through extensive research and experiments, which will be described below.

When the second structure is simply reversed to configure the first structure, the third electron transport layer with the second structure becomes the third electron transport layer with the first structure and the fifth emission layer 323 of the third emission part 30 may be in the position having an optically low emission efficiency. Accordingly, to improve the luminous efficiency of the fifth emission layer 323 of the third emission part 30, a thickness of the third electron transport layer with the first structure may be configured to be larger than the thickness of the third electron transport layer with the second structure. As the thickness of the third electron transport layer with the first structure is increased, there may be a problem in that the driving voltage is increased. According to an example embodiment of the present disclosure, a refractive index of the third electron transport layer is controlled or adjusted to reduce the thickness of the third electron transport layer so that the problem in that the driving voltage is increased may be improved.

According to an example embodiment of the present disclosure, the thickness of the third electron transport layer 321 may be different from the thickness of the first electron transport layer 121. For example, the thickness of the third electron transport layer 321 may be smaller than the thickness of the first electron transport layer 121. The thickness of the third electron transport layer 321 may be different from the thickness of the second electron transport layer 221. For example, the thickness of the third electron transport layer 321 may be larger than the thickness of the second electron transport layer 221. The thickness of the first electron transport layer 121 may be different from the thickness of the second electron transport layer 221. For example, the thickness of the first electron transport layer 121 may be smaller than the thickness of the second electron transport layer 221. Thus, the emission parts may be configured in an optically efficient position so that the efficiency and/or the lifespan may be improved.

According to an example embodiment of the present disclosure, the thickness of the third electron transport layer 321 may be larger than the thickness of the second electron transport layer 221, and smaller than the thickness of the first electron transport layer 121. For example, the thickness of the third electron transport layer 321 may be 30 nm or more to 50 nm or less, but example embodiments of the present disclosure are not limited thereto. For example, the thickness of the second electron transport layer 221 may be 10 nm or more to 30 nm or less, but example embodiments of the present disclosure are not limited thereto. For example, the thickness of the first electron transport layer 121 may be 80 nm or more to 100 nm or less, but example embodiments of the present disclosure are not limited thereto.

According to an example embodiment of the present disclosure, at least one or more of the first to third electron transport layers 121, 221, and 321 may include a phenanthroline-based material or triazole-based material, but example embodiments of the present disclosure are not limited thereto. For example, at least one or more of the first to third electron transport layers 121, 221, and 321 may be BCP(2,9-dimethyl-4,7-diphenyl-1,10-phenanthroline), Bphen(4,7-dipnehyl-1,10-phenanthroline), NBphen(2,9-bis(naphthalene-2-yl)-4.7-diphenyl-1,10-phenanthroline), HNBphen(2-(naphthalene-2-yl)-4,7-diphenyl-1,10-phenanthroline), TAZ(3-(4-biphenyl)-4-phenyl-5-tert-butylphenyl-1,2,4-triazole), TmPPPyTz(2,4,6-tris(3'-(pyridine-3-yl)biphenyl-3-yl)-1,3,5-triazine), DPyBPTz(2-(biphenyl-4-yl)-4,6-bis(4'-(pyridine-2-yl)biphenyl-4-yl)-1,3,5-triazine), Lig(8-hytdoxyquinolinolato-lithium), or BAlq(Bis(2-methyl-8-uinolinolate)-4-(phenylphenolato) aluminum), but example embodiments of the present disclosure are not limited thereto.

According to an example embodiment of the present disclosure, a sum of the thickness of the first charge generation layer 112 and the thickness of the first electron transport layer 121 may be different from a sum of the thickness of the third charge generation layer 142 and the thickness of the second electron transport layer 221. For example, the sum of the thickness of the first charge generation layer 112 and the thickness of the first electron transport layer 121 may be larger than the sum of the thickness of the third charge generation layer 142 and the thickness of the second electron transport layer 221. For example, the thickness of the first charge generation layer 112 may be 5 nm or more to 20 nm or less, but example embodiments of the present disclosure are not limited thereto. For example, the thickness of the third charge generation layer 142 may be 5 nm or more to 20 nm or less, but example embodiments of the present disclosure are not limited thereto.

According to an example embodiment of the present disclosure, the first charge generation layer 112 may be the fifth charge generation layer. A sum of the thickness of the fifth charge generation layer and the thickness of the first electron transport layer 121 may be different from a sum of the thickness of the third charge generation layer 142 and the thickness of the second electron transport layer 221. For example, the sum of the thickness of the fifth charge generation layer and the thickness of the first electron transport layer 121 may be larger than the sum of the thickness of the third charge generation layer 142 and the thickness of the second electron transport layer 221. For example, the thickness of the fifth charge generation layer may be 5 nm or more to 20 nm or less, but example embodiments of the present disclosure are not limited thereto. For example, the thickness of the third charge generation layer 142 may be 5 nm or more to 20 nm less, but example embodiments of the present disclosure are not limited thereto.

According to an example embodiment of the present disclosure, a sum of the thickness of the fifth charge generation layer 242 and the thickness of the third electron transport layer 321 may be different from a sum of the thickness of the third charge generation layer 142 and the thickness of the second electron transport layer 221. For example, the sum of the thickness of the fifth charge generation layer 242 and the thickness of the third electron transport layer 321 may be larger than the sum of the thickness of the third charge generation layer 142 and the thickness of the second electron transport layer 221. For example, the thickness of the fifth charge generation layer 242 may be 10 nm or more to 30 nm less, but example embodiments of the present disclosure are not limited thereto. For example, the thickness of the fourth charge generation layer 241 may be 10 nm or more to 20 nm or less, but example embodiments of the present disclosure are not limited thereto. For example, the thickness of the second charge generation layer 141 may be 5 nm or more to 10 nm or less, but example embodiments of the present disclosure are not limited thereto.

According to an example embodiment of the present disclosure, the fifth charge generation layer 242 may be the fourth charge generation layer. A sum of the thickness of the fourth charge generation layer and the thickness of the third electron transport layer 321 may be different from a sum of the thickness of the third charge generation layer 142 and the thickness of the second electron transport layer 221. For example, the sum of the thickness of the fourth charge generation layer and the thickness of the third electron transport layer 321 may be larger than the sum of the thickness of the third charge generation layer 142 and the thickness of the second electron transport layer 221. For example, the thickness of the fourth charge generation layer may be 10 nm or more to 30 nm or less, but example embodiments of the present disclosure are not limited thereto.

According to an example embodiment of the present disclosure, a sum of the thickness of the first charge generation layer 112 and the thickness of the first electron transport layer 121 may be larger than a sum of the thickness of the fifth charge generation layer 242 and the thickness of the third electron transport layer 321, and larger than a sum of the thickness of the third charge generation layer 142 and the thickness of the second electron transport layer 221.

According to an example embodiment of the present disclosure, the first charge generation layer 112 may be the fifth charge generation layer. The fifth charge generation layer 242 may be a fourth charge generation layer. The third charge generation layer 142 may be a second charge generation layer. A sum of the thickness of the fifth charge generation layer and the thickness of the first electron transport layer 121 is larger than a sum of the thickness of the fourth charge generation layer and the thickness of the third electron transport layer 321, and may be larger than a sum of the thickness of the second charge generation layer and the thickness of the second electron transport layer 221.

According to an example embodiment of the present disclosure, the first emission part 10 may be disposed between the first charge generation layer 112 and the second charge generation layer 141. The second emission part 20 may be disposed between the third charge generation layer 142 and the fourth charge generation layer 241. The third emission part 30 may be disposed between the fifth charge generation layer 242 and the second electrode 303. For example, the thickness of the first emission part 10 may be a thickness including one or more layers between the first charge generation layer 112 and the second charge generation layer 141, the first charge generation layer 112, and the second charge generation layer 141. For example, the thickness of the second emission part 10 may be a thickness including one or more layers between the third charge generation layer 142 and the fourth charge generation layer 241, the third charge generation layer 142, and the fourth charge generation layer 241. For example, the thickness of the third emission part 30 may be a thickness including one or more layers between the fifth charge generation layer 242 and the second electrode 303, and the fifth charge generation layer 242.

According to an example embodiment of the present disclosure, the second charge generation layer 141 may be the first charge generation layer. For example, the first emission part may include the first charge generation layer, and one or more layers between the first electrode 301 and the first charge generation layer. The third charge generation layer 141 may be a second charge generation layer. The fourth charge generation layer 241 may be a third charge generation layer. For example, the second emission part 20 may include the second charge generation layer and the third charge generation layer, and one or more layers between the second charge generation layer and the third charge generation layer. The fifth charge generation layer 242 may be a fourth charge generation layer. For example, the third emission part 30 may include the fourth charge generation layer, and one or more layers between the fourth charge generation layer and the second electrode 303.

According to an example embodiment of the present disclosure, the thickness of the third emission part 30 may be different from the thickness of the second emission part 20. For example, the thickness of the third emission part 30 may be larger than the thickness of the second emission part 20. The thickness of the third emission part 30 may be a thickness of layers between the fourth charge generation layer 241 and the anode electrode 303. The thickness of the second emission part may be a thickness of layers between the second charge generation layer 141 and the fifth charge generation layer 242. For example, the thickness of the third emission part 30 may be 145 nm or more to 155 nm or less, but example embodiments of the present disclosure are not limited thereto. For example, the thickness of the second emission part 20 may be 110 nm or more to 130 nm or less, but example embodiments of the present disclosure are not limited thereto.

According to an example embodiment of the present disclosure, the thickness of the first emission part 10 may be different from the thickness of the third emission part 30. For example, the thickness of the first emission part 10 may be larger than the thickness of the third emission part 30. The thickness of the first emission part 10 may be a thickness of layers between the cathode electrode 301 and the third charge generation layer 142. For example, the thickness of the first emission part 10 may be 145 nm or more to 155 nm or less, but example embodiments of the present disclosure are not limited thereto.

According to an example embodiment of the present disclosure, the thickness of the first emission part 10 may be larger than the thickness of the third emission part 30 and larger than the thickness of the second emission part 20.

According to an example embodiment of the present disclosure, it may be advantageous to control or adjust an optical cavity by controlling the thickness of the third electron transport layer 321 of the third emission part 30, rather than controlling the thickness of the first electron transport layer 121 of the first emission part 10 and/or the second electron transport layer 221 of the second emission part 20. For example, when the thickness of the first electron transport layer 121 of the first emission part 10 is controlled or adjusted, the viewing angle characteristic in a white may be degraded so that the viewing angle characteristic in a white may be improved by controlling the thickness of the third electron transport layer 321.

The thickness of the third electron transport layer 321 may be lowered by controlling a refractive index of the third electron transport layer 321. Table 1 represents a driving voltage, an efficiency, and a viewing angle characteristic of Comparative Example and Example Embodiments of the present disclosure.

TABLE 1

| | Driving Voltage | Red Efficiency | Green Efficiency | Blue Efficiency | White Efficiency | Viewing Angle |
|---|---|---|---|---|---|---|
| Comp. Ex. | 100% | 100% | 100% | 100% | 100% | 0.0228 |
| Ex. 1 | +0.5 V | 125% | 99% | 96% | 105% | 0.0238 |
| Ex. 2 | +0.5 V | 142% | 97% | 93% | 108% | 0.0281 |
| Ex. 3 | +0.1 V | 140% | 99% | 99% | 109% | 0.0266 |
| Ex. 4 | −0.3 V | 137% | 100% | 101% | 109% | 0.0248 |
| Ex. 5 | −0.7 V | 134% | 100% | 99% | 108% | 0.0234 |
| Ex. 6 | −1.1 V | 131% | 100% | 92% | 107% | 0.0233 |

In Table 1, in Comparative Example, an emission part is configured on an anode electrode. A first emission part of Comparative Example may include a first hole transport layer on an anode electrode, a first emission layer on the first hole transport layer, and a first electron transport layer on the first emission layer. The first n-type charge generation layer and the first p-type charge generation layer may be disposed between the first emission part and the second emission part. A second emission part of Comparative Example may include a second hole transport layer on the first p-type charge generation layer, a second emission layer on the second hole transport layer, and a second electron transport layer on the second emission layer. A second n-type charge generation layer and a second p-type charge generation layer may be disposed between the second emission part and the third emission part. A third emission part of Comparative Example may include a third hole transport layer on the second p-type charge generation layer, a third emission layer on the third hole transport layer, and a third electron transport layer on the third emission layer. The cathode electrode may be disposed on the third electron transport layer. The first emission layer and the third emission layer may be blue emission layers, and the second emission layer may be a red emission layer, a yellow-green emission layer, and a green emission layer.

In Example Embodiments 1 to 6, an emission part is configured on a cathode electrode. For example, the light emitting structure of FIG. 5 is configured.

In Table 1, when the driving voltage and the efficiency of Comparative Example are 100%, driving voltages and efficiencies of Example Embodiments 1 to 6 are compared. The viewing angle may be a color viewing angle Δu'v' according to a viewing angle. A rate of change of a color viewing angle was measured by tilting the color viewing angle Δu'v' according to the viewing angle from 0° which is seen from the front of the display apparatus to 15°, 30°, 45°, and 60°. The color viewing angle Δu'v' which is equal to or lower than 0.0300 is a maximum tilting angle at which a normal screen may be viewed from the front of the display apparatus. The maximum tilting angle may be 60° to 90°. Here, it is assumed that the angle is 60°. Accordingly, the color viewing angle Δu'v' may be a difference between a color viewing angle at 0° of the display apparatus and a color viewing angle at 60° of the display apparatus. When the display apparatus is configured as a white light emitting display apparatus, emission layers having two or more colors to emit white light are configured so that when the ratio of spectrum change of emission layers having two or more colors varies according to the viewing angle, color difference may be caused. As the color viewing angle Δu'v' is smaller, it is difficult for a consumer to sense a color difference so that a screen which does not have a color difference depending on a position viewing the display apparatus or a viewing angle. When the color viewing angle at a viewing angle of 60° is 0.0300 or more, the consumer may feel that colors may be looked differently according to a position of viewing a display apparatus or a viewing angle which is a viewing direction. Accordingly, when the color viewing angle at a viewing angle of 60° is 0.0300 or less, the problem in that the color is looked differently according to a viewing angle of the display apparatus is solved, so that the color difference may be improved.

A refractive index of the third electron transport layer of Comparative Example and Example Embodiment 1 was 1.82, and a refractive index of the third electron transport layer of Example Embodiments 2 to 6 was 1.94.

In a comparative example, a thickness of the third electron transport layer was 23 nm and a thickness of the third hole transport layer was 70 nm.

In Example Embodiments 1 and 2, a thickness of the third electron transport layer was 70 nm and a thickness of the fourth hole transport layer was 10 nm. In Example Embodiment 3, a thickness of the third electron transport layer was 60 nm and a thickness of the fourth hole transport layer was 20 nm. In Example Embodiment 4, a thickness of the third electron transport layer was 50 nm and a thickness of the fourth hole transport layer was 30 nm. In Example Embodiment 5, a thickness of the third electron transport layer was 40 nm and a thickness of the fourth hole transport layer was 40 nm. In Example Embodiment 6, a thickness of the third electron transport layer was 30 nm and a thickness of the fourth hole transport layer was 50 nm.

However, the thickness of the third electron transport layer and the thickness of the fourth hole transport layer do not limit embodiments of the present disclosure.

In Comparative Example and Example Embodiment 1, the refractive index of the third electron transport layer was configured to be the same and the thickness of the third electron transport layer of Example Embodiment 1 was configured to be thicker than the thickness of the third electron transport layer of Comparative Example. According to Example Embodiment 1, when the light emitting structure was configured on the cathode electrode, the thickness of the third electron transport layer was configured to be thick. Thus, a red efficiency of Example Embodiment 1 was increased by 25% than Comparative Example, and a white efficiency of Example Embodiment 1 was increased by 5% than Comparative Example. The viewing angle of Example Embodiment 1 was 0.0238 which was improved from Comparative Example. And, the thickness of the third electron transport layer of Example Embodiment 1 was increased more than Comparative Example, the driving voltage was increased by 0.5 V from that of Comparative Example.

In Example Embodiments 1 and 2, the thickness of the third electron transport layer and the thickness of the fourth hole transport layer were configured to be the same and a refractive index of the third electron transport layer of Example Embodiment 2 was configured to be larger than that of Example Embodiment 1. Thus, a red efficiency of Example Embodiment 2 was increased by 17% than Example Embodiment 1 and a white efficiency of Example Embodiment 2 was increased by 3% than Example Embodiment 1. And, the thickness of the third electron transport layer of Example Embodiment 2 was increased more than Comparative Example, the driving voltage was increased by 0.5 V from that of Comparative Example. For example, it shows that when the refractive index of the electron transport layer was large and the thickness of the electron transport layer was the same, the red efficiency and the white efficiency were increased.

In Example Embodiments 3 to 6, the refractive index of the third electron transport layer was adjusted to be the same as that of Example Embodiment 2 and the thickness of the third electron transport layer was configured to be smaller than that of Example Embodiment 2. For example, the refractive index of the third electron transport layer of Example Embodiment 3 to 6 was 1.94. In Example Embodiment 3, a thickness of the third electron transport layer was 60 nm and a thickness of the fifth hole transport layer was 20 nm. In Example Embodiment 4, a thickness of the third electron transport layer was 50 nm and a thickness of the fifth hole transport layer was 30 nm. In Example Embodiment 5, a thickness of the third electron transport layer was 40 nm and a thickness of the fifth hole transport layer was 40 nm. In Example Embodiment 6, a thickness of the third electron transport layer was 30 nm and a thickness of the fifth hole transport layer was 50 nm.

According to an example embodiment of the present disclosure, to make the balance of the holes and the electrons of the fifth light emitting layer 323 of the third emission part 30, the thickness of the fifth hole transport layer 333 may be controlled or adjusted. The hole mobility is larger than the electron mobility so that the thickness of the fifth hole transport layer 333 may be controlled or adjusted. For example, the thickness of the fifth hole transport layer 333 of Example Embodiments 2 to 6 may be configured to be larger than the thickness of the fifth hole transport layer of Example Embodiment 1. Thus, a luminous efficiency of the fifth emission layer 323 may be improved.

According to an example embodiment of the present disclosure, the thickness of the fifth hole transport layer 333 may be different from the thickness of the first hole transport layer 131. For example, the thickness of the fifth electron transport layer 333 may be larger than the thickness of the first hole transport layer 131. According to an example embodiment of the present disclosure, the thickness of the fifth hole transport layer 333 may be different from the thickness of the second hole transport layer 133. For example, the thickness of the fifth hole transport layer 333 may be larger than the thickness of the second hole transport layer 133. For example, the thickness of the first hole transport layer 131 may be 5 nm or more to 15 nm or less, but example embodiments of the present disclosure are not limited thereto. For example, the thickness of the second hole transport layer 133 may be 5 nm or more to 15 nm or less, but example embodiments of the present disclosure are not limited thereto. For example, the thickness of the fifth hole transport layer 333 may be 35 nm or more to 45 nm or less, but example embodiments of the present disclosure are not limited thereto.

According to an example embodiment of the present disclosure, the thickness of the third hole transport layer 231 may be different from the thickness of the first hole transport layer 131. For example, the thickness of the third electron transport layer 231 may be larger than the thickness of the first hole transport layer 131. According to an example embodiment of the present disclosure, the thickness of the third hole transport layer 231 may be different from the thickness of the second hole transport layer 133. For example, the thickness of the third hole transport layer 231 may be larger than the thickness of the second hole transport layer 133. For example, the thickness of the third hole transport layer 231 may be 25 nm or more to 40 nm or less, but example embodiments of the present disclosure are not limited thereto.

According to an example embodiment of the present disclosure, the thickness of the fifth hole transport layer 333 may be larger than the thickness of the third hole transport layer 231, and larger than the thickness of the first hole transport layer 131. According to an example embodiment of the present disclosure, the thickness of the fifth hole transport layer 333 may be larger than the thickness of the third hole transport layer 231, and larger than the thickness of the second hole transport layer 133.

According to an example embodiment of the present disclosure, at least one or more of the first to fifth hole transport layers 131, 133, 231, 233, and 333 may be configured with a benzidine based material, but example embodiments of the present disclosure are not limited thereto. For example, at least one or more of first to fifth hole transport layers 131, 133, 231, 233, and 333 may be NPB(N, N'-bis(naphthalene-1-yl)-N, N'-bis(phenyl)-benzidine), TPD(N, N'-bis(3-methylphenyl)-N, N'-bis(phenyl)-benzidine), Spiro-NPB(N, N'-bis(naphthalene-1-yl)-N, N'-bis(phenyl)-2,7-diamino-9,9-spirobifluorene), or Spiro-TPD (N, N'-bis(3-methylphenyl)-N, N'-bis(phenyl)-2,7-diamino-9,9-spirobifluorene), but example embodiments of the present disclosure are not limited thereto.

According to an example embodiment of the present disclosure, a sum of the thickness of the third electron transport layer 321 and the thickness of the fifth hole transport layer 333 may be different from a sum of the thickness of the second electron transport layer 221 and the thickness of the third hole transport layer 231. For example, the sum of the thickness of the third electron transport layer 321 and the thickness of the fifth hole transport layer 333 may be larger than the sum of the thickness of the second electron transport layer 221 and the thickness of the third hole transport layer 231. According to an example embodiment of the present disclosure, a sum of the thickness of the third electron transport layer 321 and the thickness of the fifth hole transport layer 333 may be different from a sum of the thickness of the first electron transport layer 121 and the thickness of the first hole transport layer 131. For example, the sum of the thickness of the third electron transport layer 321 and the thickness of the fifth hole transport layer 333 may be smaller than the sum of the thickness of the first electron transport layer 121 and the thickness of the first hole transport layer 131. According to an example embodiment of the present disclosure, a sum of the thickness of the third electron transport layer 321 and the thickness of the fifth hole transport layer 333 may be different from a sum of the thickness of the first electron transport layer 121 and the thickness of the second hole transport layer 133. For example, the sum of the thickness of the third electron transport layer 321 and the thickness of the fifth hole transport layer 333 may be smaller than the sum of the thickness of the first electron transport layer 121 and the thickness of the second hole transport layer 133. According to an example embodiment of the present disclosure, a sum of the thickness of the first electron transport layer 121 and the thickness of the first hole transport layer 131 may be different from a sum of the thickness of the second electron transport layer 221 and the thickness of the third hole transport layer 231. For example, the sum of the thickness of the first electron transport layer 121 and the thickness of the first hole transport layer 131 may be larger than the sum of the thickness of the second electron transport layer 221 and the thickness of the third hole transport layer 231. According to an example embodiment of the present disclosure, a sum of the thickness of the first electron transport layer 121 and the thickness of the second hole transport layer 133 may be different from a sum of the thickness of the second electron transport layer 221 and the thickness of the third hole transport layer 231. For example, the sum of the thickness of the first electron transport layer 121 and the thickness of the second hole transport layer 133 may be larger than the sum of the thickness of the second electron transport layer 221 and the thickness of the third hole transport layer 231. For example, the thickness of the first hole transport layer 131 may be equal to the thickness of the second hole transport layer 133, but example embodiments of the present disclosure are not limited thereto. For example, the thickness of the first hole transport layer 131 may be 5 nm or more to 15 nm or less, but example embodiments of the present disclosure are not limited thereto. For example, the thickness of the second hole transport layer 133 may be 5 nm or more to 15 nm or less, but example embodiments of the present disclosure are not limited thereto. For example, the thickness of the third hole transport layer 231 may be 25 nm or more to 40 nm or less, but example embodiments of the present disclosure are not limited thereto. For example, the thickness of the fourth hole transport layer 331 may be 5 nm or more to 15 nm or less, but example embodiments of the present disclosure are not limited thereto. For example, the thickness of the fifth hole transport layer 133 may be 35 nm or more to 45 nm or less, but example embodiments of the present disclosure are not limited thereto.

Referring to Table 1, in Example Embodiment 3, the refractive index of the third electron transport layer was configured to be the same compared with Example Embodiment 2 and the thickness of the third electron transport layer was configured to be small compared with Example Embodiment 1. In Example Embodiment 3, the thickness of the third electron transport layer was smaller than that of Example Embodiment 2, thus the driving voltage was lowered more than that of Example Embodiment 2. As compared with Example Embodiment 2, in Example Embodiment 3, a red efficiency was similar, and a green efficiency, a blue efficiency, and a white efficiency were increased, and the viewing angle was 0.0266, which was improved more than Example Embodiment 2. Accordingly, when the refractive index of the third electron transport layer was large and the thickness of the electron transport layer was small, it shows that the driving voltage was reduced, the green efficiency, the blue efficiency, and the white efficiency were increased, and the viewing angle was improved.

As compared with Example Embodiment 1, the refractive index of the third electron transport layer of Example Embodiment 3 was high and the thickness of the third electron transport layer was small, thus, the driving voltage was lower than that of Example Embodiment 1 and the red efficiency, the blue efficiency, and the white efficiency were improved. Therefore, as compared with Example Embodiment 1, the refractive index of the third electron transport layer of Example Embodiment 3 was high and the thickness of the third electron transport layer was small, thus, the driving voltage was lower than that of Example Embodiment 1 and the red efficiency, the blue efficiency, and the white efficiency were improved. For example, as compared with Comparative Example, the driving voltage of Example Embodiment 3 was +0.1 V, which was slightly increased. Accordingly, in Example Embodiment 3 in which the refractive index of the third electron transport layer was high and the thickness of the third electron transport layer was configured to be small, the red efficiency and the white efficiency were improved more than those of Comparative Example.

In Example Embodiment 4, the thickness of the third electron transport layer was smaller than that of Example Embodiment 2, thus, the driving voltage was reduced more than that of Example Embodiment 2. As compared with Example Embodiment 2, in Example Embodiment 4, the white efficiency was similar, the green efficiency and the blue efficiency were improved, and the viewing angle was 0.0248, which was improved more than Example Embodiment 2. As compared with Example Embodiment 1, the refractive index of the third electron transport layer of Example Embodiment 4 was high and the thickness of the third electron transport layer was small, thus, the driving voltage was lower than that of Example Embodiment 1 and the red efficiency, the blue efficiency, and the white efficiency were improved. Accordingly, in Example Embodiment 4 in which the refractive index of the third electron transport layer was high and the thickness of the third electron transport layer was configured to be small, the driving voltage was reduced more than Example Embodiment 1, and the red efficiency, the green efficiency, the blue efficiency, and the white efficiency were improved more than Example Embodiment 1. For example, as compared with Comparative Example, the driving voltage of Example Embodiment 4 was reduced to –0.3V. Accordingly, in Example Embodiment 4 in which the refractive index of the third electron transport layer was high and the thickness of the third electron transport layer was configured to be small, the driving voltage was reduced more than Comparative Example and the red efficiency, the blue efficiency, and the white efficiency were improved.

In Example Embodiment 5, the thickness of the third electron transport layer was smaller than that of Example Embodiment 2, thus, the driving voltage was reduced more than that of Example 2. As compared with Example Embodiment 2, in Example Embodiment 5, the green efficiency and the blue efficiency were improved, and the viewing angle was 0.0234, which was improved more than Example Embodiment 2. As compared with Example Embodiment 1, the refractive index of the third electron transport layer of Example Embodiment 5 was high and the thickness of the third electron transport layer was configured to be small, so that the driving voltage was lower than that of Example Embodiment 1. Further, the red efficiency, the green efficiency, the blue efficiency, and the white efficiency were improved, and the viewing angle was 0.234 which was improved more than Example Embodiment 1. Accordingly, in Example Embodiment 5 in which the refractive index of the third electron transport layer was high and the thickness of the third electron transport layer was configured to be small, the driving voltage was reduced more than Example Embodiment 1, and the red efficiency, the green efficiency, the blue efficiency, and the white efficiency were improved more than Example Embodiment 1 and the viewing angle was improved. For example, as compared with Comparative Example, the driving voltage of Example Embodiment was reduced to –0.7V. Accordingly, in Example Embodiment 5 in which the refractive index of the third electron transport layer was high and the thickness was configured to be small, the driving voltage was reduced more than Comparative Example and the red efficiency and the white efficiency were improved more than Comparative Example.

In Example Embodiment 6, the thickness of the third electron transport layer was smaller than that of Example Embodiment 2 so that the driving voltage was reduced more than that of Example Embodiment 2. As compared with Example Embodiment 2, in Example Embodiment 6, the green efficiency was improved, and the viewing angle was 0.0233, which was improved more than Example Embodiment 2. As compared with Example Embodiment 1, the refractive index of the third electron transport layer of Example Embodiment 6 was high and the thickness of the third electron transport layer was small, so that the driving voltage was lower than that of Example Embodiment 1 and the red efficiency, the green efficiency, and the white efficiency were improved and the viewing angle was improved. Accordingly, in Example Embodiment 6 in which the refractive index of the third electron transport layer was high and the thickness was configured to be small, the driving voltage was reduced more than Example Embodiment 1, and the red efficiency, the green efficiency, and the white efficiency were improved more than Example Embodiment 1 and the viewing angle was 0.0233 which was improved more than Example Embodiment 1. For example, as compared with Comparative Example, the driving voltage of Example Embodiment 6 was reduced to –1.1 V. Accordingly, in Example Embodiment 6 in which the refractive index of the third electron transport layer was high and the thickness was configured to be small, the driving voltage was reduced more than Comparative Example and the red efficiency and the white efficiency were improved more than Comparative Example.

According to an example embodiment of the present disclosure, in Example Embodiments 4 and 5 in which the refractive index of the third electron transport layer was high and the thickness was small, as compared with Example Embodiments 2, 3, and 6, it shows that the driving voltage was reduced and the efficiency and the viewing angle were improved. For example, according to an example embodiment in which the refractive index of the electron transport layer was 1.82 to 1.94, and the thickness of the electron transport layer was configured to be 30 nm or more and/or 50 nm or less, it shows that the driving voltage was reduced, the red efficiency, the green efficiency, and the white efficiency were improved and the viewing angle was improved. According to an example embodiment of the present disclosure, the refractive index of the electron transport layer may be 1.74 or more to 2.0 or less in the wavelength of 380 nm to 780 nm. According to an example embodiment of the present disclosure, the refractive index of the electron transport layer may be 1.96 or more to 2.36 or less in the wavelength of 380 nm to 780 nm.

According to an example embodiment of the present disclosure, in Example Embodiments 4 and 5 in which the refractive index of the electron transport layer was configured to be larger than 1.82, as compared with Comparative Example, it shows that the driving voltage was reduced, the red efficiency, the green efficiency, the blue efficiency, and the white efficiency were improved and the viewing angle was improved.

According to an example embodiment of the present disclosure, in Example Embodiments 4 and 5 in which the refractive index of the electron transport layer was configured to be larger than 1.82, as compared with Example Embodiment 1, it shows that the driving voltage was reduced, the red efficiency, the green efficiency, the blue efficiency, and the white efficiency were improved and the viewing angle was improved.

According to an example embodiment of the present disclosure, in Example Embodiments 4 and 5 in which refractive index of the electron transport layer was configured to be larger than 1.82 and the thickness of the electron transport layer was configured to be 40 nm or more to 50 nm or less, as compared with Comparative Example, it shows that the driving voltage was reduced, the red efficiency, the green efficiency, the blue efficiency, and the white efficiency were improved and the viewing angle was improved.

According to an example embodiment of the present disclosure, in Example Embodiments 4 and 5 in which the refractive index of the electron transport layer was configure to be larger than 1.82 and the thickness of the electron transport layer was configured to be 40 nm or more to 50 nm or less, as compared with Example Embodiment 1, it shows that the driving voltage was reduced, the red efficiency, the green efficiency, the blue efficiency, and the white efficiency were improved and the viewing angle was similar or was improved.

According to an example embodiment of the present disclosure, to reduce the thickness of the electron transport layer, the refractive index of the electron transport layer may be adjusted to be high. The refractive index of the electron transport layer may be adjusted by considering at least one of the driving voltage, the efficiency, and the viewing angle. For example, the thickness of the electron transport layer is reduced by increasing the refractive index of the electron transport layer so that the driving voltage may be reduced, but at least one or more of the efficiency and the viewing angle may be reduced. The refractive index of the electron transport layer was increased to reduce the thickness of the electron transport layer so that the efficiency may be reduced or the viewing angle may be reduced. According to an example embodiment of the present disclosure, the refractive index of the electron transport layer and/or the thickness of the electron transport layer may be adjusted by considering at least one of the driving voltage, the efficiency, and the viewing angle.

According to an example embodiment of the present disclosure, the refractive index of the third electron transport layer was configured to be high and the thickness of the third electron transport layer was configured to be thin, so that a display apparatus in which the driving voltage is reduced and the efficiency and the viewing angle are improved may be provided. The refractive index of the electron transport layer may be 1.82 or larger to 1.94 or less. The thickness of the electron transport layer may be configured to be 30 nm or more and/or 50 nm or less. For example, the refractive index of the third electron transport layer may be 1.90 or more to 2.10 or less. The thickness of the third electron transport layer may be 30 nm or more and/or 50 nm or less.

Figure 6:
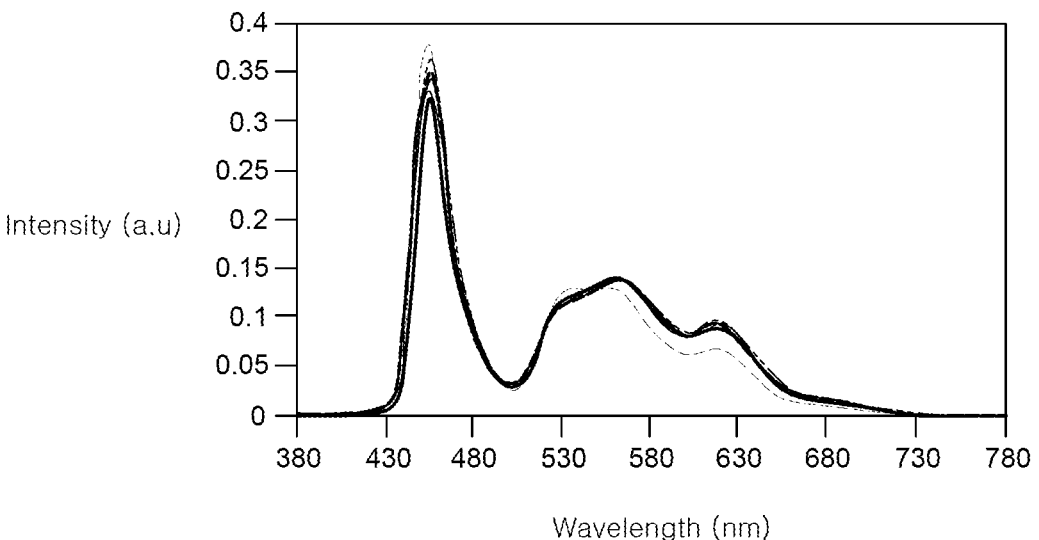
FIG. 6 illustrates a spectrum according to Example and Comparative Example of the present disclosure.

FIG. 6 illustrates a spectrum according to Comparative Example and an example embodiment of the present disclosure.

In FIG. 6, a horizontal axis represents a wavelength region (nm) of light and a vertical axis represents an emission intensity (arbitrary part: a.u.). The emission intensity is a numerical value which is represented as a relative value with respect to a maximum value of an electroluminescence (EL) spectrum. The electroluminescence (EL) may refer to light which is finally emitted by the display apparatus and may be represented by a product of photoluminescence (PL) and emittance. A wavelength at which organic layers configuring an emission part emits unique light is referred to as photoluminescence (PL) and light emitted by the influence of the thickness or the optical characteristic of layers configuring the organic layers may be referred to as emittance.

FIG. 6 illustrates Table 1 as a spectrum. In FIG. 6, Comparative Example is represented with a dotted line and Example Embodiment 1 is represented with a dotted line. Example Embodiment 2 is represented with a thin solid line and Example Embodiment 3 is represented with a one-dot chain line. Example Embodiment 4 is represented with a two-dot chain line, Example Embodiment 5 is represented with a thick solid line, and Example Embodiment 6 is represented with a thick dotted line.

Referring to FIG. 6, it shows that the emission intensity of Example Embodiments 4 and is large in 420 nm to 480 nm which is a wavelength corresponding to the blue region. Further, it shows that the emission intensity of Example Embodiments 4 and 5 is large in 510 nm to 590 nm which is a wavelength corresponding to the yellow-green region. Further, it shows that the emission intensity of Example Embodiments 4 and 5 is large in 600 nm to 650 nm which is a wavelength corresponding to the red region.

According to an example embodiment of the present disclosure, to reduce the thickness of the electron transport layer, the refractive index of the electron transport layer may be adjusted to be high. The refractive index of the electron transport layer may be adjusted in consideration of the emission intensity.

According to an example embodiment of the present disclosure, the refractive index of the electron transport layer may be 1.82 or larger to 1.94 or less. According to an example embodiment of the present disclosure, the thickness of the electron transport layer may be 30 nm or more and/or 50 nm or less. According to an example embodiment of the present disclosure, it shows that when the refractive index of the electron transport layer is 1.82 or larger to 1.94 or less and the thickness of the electron transport layer is 30 nm or more and/or 50 nm or less, the emission intensity is increased in a wavelength corresponding to the blue, yellow-green, and red regions.

Figure 7:
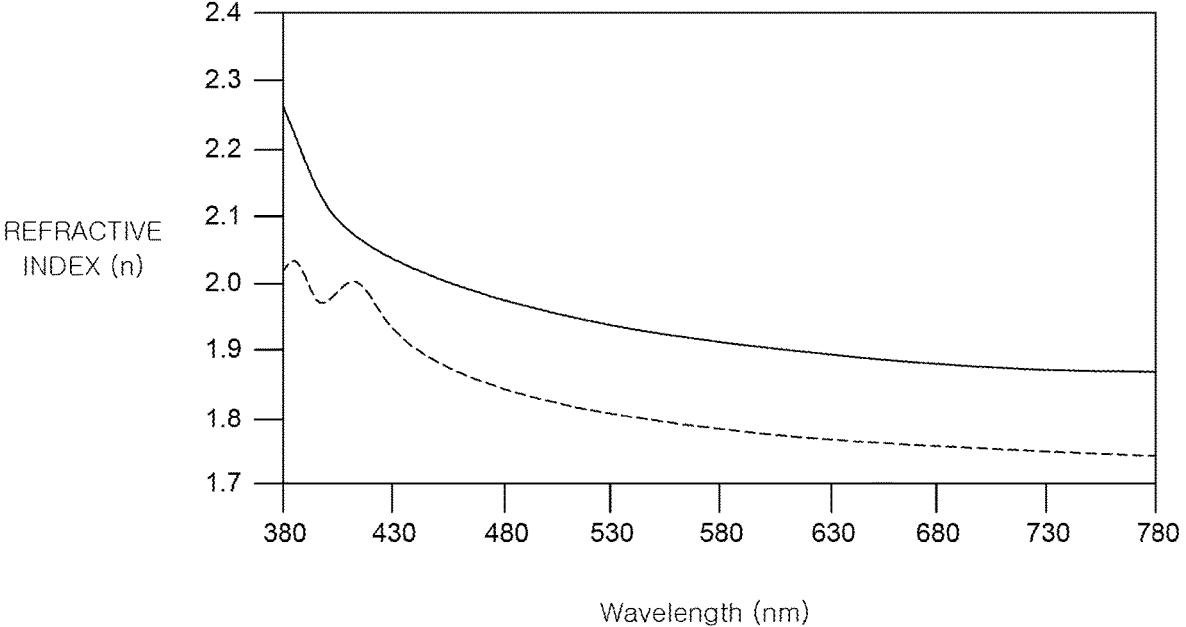
FIG. 7 illustrates a refractive index according to an example embodiment of the present disclosure.

FIG. 7 illustrates a refractive index according to an example embodiment of the present disclosure.

FIG. 7 illustrates a refractive index according to a wavelength. In FIG. 7, the horizontal axis represents a light wavelength region (nm) and the vertical axis represents the refractive index. The solid line represents the refractive index of Example Embodiments 2 to 6 and the dotted line indicates the refractive index of Comparative Example and Example Embodiment 1.

Referring to FIG. 7, the refractive index of the electron transport layer which is a dotted line may be 1.74 to 2.03 in a wavelength of 380 nm to 780 nm. The refractive index of the electron transport layer which is represented with the solid line may be 1.86 to 2.25 in the wavelength of 380 nm to 780 nm. According to an example embodiment of the present disclosure, the refractive index of the electron transport layer may be 1.74 to 2.0 or less in the wavelength of 380 nm to 780 nm. According to an example embodiment of the present disclosure, the refractive index of the electron transport layer may be 1.96 or more to 2.0 or less in the wavelength of 380 nm to 780 nm.

In Table 2, as compared with Table 1, the thickness of the third electron transport layer 321 and the refractive index of the third electron transport layer 321 are changed. In Table 1, when the refractive index of the third electron transport layer 321 was large, the characteristic of the display apparatus was measured in accordance with the change in the thickness of the third electron transport layer 321. Accordingly, the refractive index of the third electron transport layer 321 was large to reduce the thickness of the third electron transport layer 321 so that it was confirmed that as compared with Example Embodiment 1, the driving voltage was reduced and the efficiency and the viewing angle characteristic may be improved or in a same level. Because the thickness of the third electron transport layer 321 was reduced by increasing the refractive index of the third electron transport layer 321, experiment was conducted on the refractive index of the third electron transport layer 321 and the thickness of the third electron transport layer 321 which did not affect the characteristic of the display apparatus. For example, when the thickness of the third electron transport layer 321 was reduced and the refractive index of the third electron transport layer 321 was increased, the driving voltage, the efficiency, and the viewing angle characteristic were measured. The following Table 2 represents a driving voltage, an efficiency, and a viewing angle characteristic of Comparative Example and Example Embodiments.

than that of Comparative Example and Example Embodiment 1. The refractive index of the third electron transport layer of Example Embodiment 7 was configured to be 2.04. The refractive index of the third electron transport layer of Example Embodiment 8 was configured to be 2.14. The refractive index of the third electron transport layer of Example Embodiment 9 was configured to be 2.24.

As compared with Comparative Example, in Example Embodiment 7, the thickness of the third electron transport layer was small and the refractive index of the third electron transport layer was large so that the driving voltage was reduced more than Comparative Example. For example, as compared with Comparative Example, the driving voltage of Example Embodiment 7 was reduced to −0.9 V. As compared with Comparative Example, the red efficiency and the white efficiency of Example Embodiment 7 were improved. As compared with Example Embodiment 1, the driving voltage of Example Embodiment 7 was reduced, the red efficiency, the green efficiency, and the white efficiency of Example Embodiment 7 were improved, and the viewing angle was improved to 0.0235 more than Example Embodiment 1.

As compared with Comparative Example, in Example Embodiment 8, the thickness of the third electron transport layer was small and the refractive index of the third electron transport layer was large so that the driving voltage was reduced more than Comparative Example. For example, as compared with Comparative Example, the driving voltage of Example Embodiment 8 was reduced to −1.0 V. As compared with Comparative Example, the red efficiency and the white efficiency of Example Embodiment 8 were improved. As compared with Example Embodiment 1, the driving voltage of Example Embodiment 8 was reduced, the red efficiency, the green efficiency, and the white efficiency of Example Embodiment 8 were improved, and the viewing angle was improved to 0.0238 which is the same as that of Example Embodiment 1.

As compared with Comparative Example, in Example Embodiment 9, the thickness of the third electron transport

TABLE 2

| | Driving Voltage | Red Efficiency | Green Efficiency | Blue Efficiency | White Efficiency | Viewing Angle |
|---|---|---|---|---|---|---|
| Comp. Ex. | 100% | 100% | 100% | 100% | 100% | 0.0228 |
| Ex. 1 | +0.5 V | 125% | 99% | 96% | 105% | 0.0238 |
| Ex. 5 | −0.7 V | 134% | 100% | 99% | 108% | 0.0234 |
| Ex. 7 | −0.9 V | 138% | 100% | 96% | 109% | 0.0235 |
| Ex. 8 | −1.0 V | 141% | 100% | 94% | 109% | 0.0238 |
| Ex. 9 | −1.1 V | 143% | 100% | 92% | 108% | 0.0238 |

In Table 2, Comparative Example, Example Embodiments 1 and 5 are configured to be the same as in Table 1 so that the description thereof may be omitted.

In Example Embodiment 7, a thickness of the third electron transport layer was 35 nm and a thickness of the fifth hole transport layer was 45 nm. In Example Embodiment 8, a thickness of the third electron transport layer was 32 nm and a thickness of the fifth hole transport layer was 48 nm. In Example Embodiment 9, a thickness of the third electron transport layer was 29 nm and a thickness of the fifth hole transport layer was 51 nm. However, the thickness of the third electron transport layer and the thickness of the fifth hole transport layer do not limit Example Embodiments of the present disclosure.

The refractive index of the third electron transport layer of Example Embodiments 7 to 9 was configured to be larger layer was small and the refractive index of the third electron transport layer was large so that the driving voltage was reduced more than Comparative Example. For example, as compared with Comparative Example, the driving voltage of Example Embodiment 9 was reduced to −1.1 V. As compared with Comparative Example, the red efficiency and the white efficiency of Example Embodiment 9 were improved. As compared with Example Embodiment 1, the driving voltage of Example Embodiment 9 was reduced, the red efficiency, the green efficiency, and the white efficiency of Example Embodiment 9 were improved, and the viewing angle was improved to 0.0238 which is the same as that of Example Embodiment 1.

According to an example embodiment of the present disclosure, the refractive index of the electron transport layer was reduced to reduce the thickness of the electron transport layer. It shows that the refractive index and the thickness of the electron transport layer need to be adjusted in consideration of the driving voltage, the efficiency, and the viewing angle characteristic.

Color coordinates of Comparative Example, Example Embodiments 1, 5, 7 to 9 of Table 2 were measured. For example, the color coordinate may be a white color coordinate based on a white color temperature 10,000 K. The color temperature 10000 K may be a temperature at which bluish white light may be output, but example embodiments of the present disclosure are not limited thereto. For example, as the white color coordinate is close to (0.281, 0.288), it is advantageous to implement bluish white of the display apparatus, but example embodiments of the present disclosure are not limited thereto. A white color coordinate of Comparative Example was (0.271, 0.287) and a white color coordinate of Example Embodiment 1 was (0.294, 0.303). A white color coordinate of Example Embodiment 5 was (0.297, 0.303), which was similar to Example Embodiment 1. A white color coordinate of Example Embodiment 7 was (0.302, 0.308), which was similar to Example Embodiment 1. A white color coordinate of Example Embodiment 8 was (0.305, 0.312) and a white color coordinate of Example Embodiment 9 was measured to be (0.308, 0.316).

According to an example embodiment of the present disclosure, in Example Embodiment 7 in which the refractive index of the electron transport layer was 2.04 or less and the thickness of the electron transport layer was 35 nm or less, it shows that as compared with Example Embodiment 1, the red efficiency, the green efficiency, and the white efficiency were improved, the blue efficiency, the viewing angle, or the white coordinate were equivalent to those of Example Embodiment 1. For example, according to an example embodiment of the present disclosure in which the refractive index of the electron transport layer was 1.94 or more to 2.04 or lees and the thickness of the electron transport layer was 40 nm or less and/or 30 nm or more, it shows that as compared with Example Embodiment 1, the driving voltage was reduced, the red efficiency, the green efficiency, and the white efficiency were improved, the blue efficiency, the viewing angle, or the white coordinate were equivalent to those of Example Embodiment 1. According to an example embodiment of the present disclosure, the refractive index of the electron transport layer may be 1.86 or more to 2.25 or less in the wavelength of 380 nm to 780 nm. According to an example embodiment of the present disclosure, the refractive index of the electron transport layer may be 1.96 or more to 2.0 or less in the wavelength of 380 nm to 780 nm.

According to an example embodiment of the present disclosure, it shows that the thickness of the electron transport layer is changed in accordance with the change in the refractive index of the electron transport layer, and thus the driving voltage, the efficiency, and the viewing angle characteristic are changed. Accordingly, the thickness of the electron transport layer is reduced to reduce the driving voltage so that it may be understood that it affects the efficiency and the viewing angle characteristic. Therefore, it may be understood that the thickness of the electron transport layer needs to be adjusted according to the refractive index of the electron transport layer in consideration of the efficiency and the viewing angle characteristic of the display apparatus. For example, to reduce the driving voltage, the thickness of the electron transport layer may be reduced by adjusting the refractive index of the electron transport layer.

However, it may be understood that the refractive index and the thickness of the electron transport layer need to be adjusted without affecting the efficiency and the viewing angle characteristic.

Figure 8:
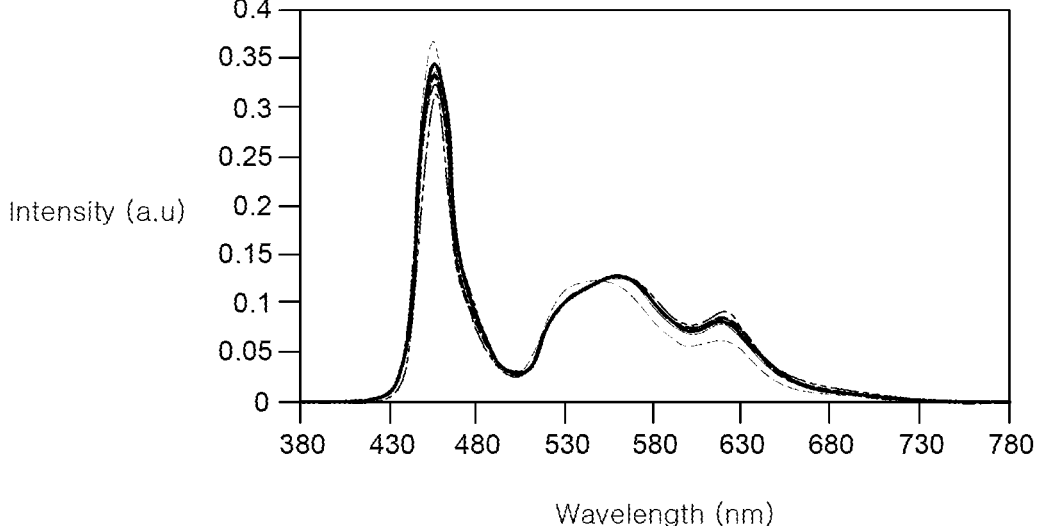
FIG. 8 illustrates a spectrum according to another example embodiment of the present disclosure and Comparative Example.

FIG. 8 illustrates a spectrum according to Comparative Example and an example embodiment of the present disclosure.

In FIG. 8, a horizontal axis represents a wavelength region (nm) of light and a vertical axis represents an emission intensity (arbitrary part: a.u.). The emission intensity is a numerical value which is represented as a relative value with respect to a maximum value of an electroluminescence (EL) spectrum.

FIG. 8 illustrates Table 2 as a spectrum. In FIG. 8, Comparative Example is represented with a dotted line and Example Embodiment 1 is represented with a solid line. Example Embodiment 5 was represented with a thick solid line, Example Embodiment 7 was represented with a thick dotted line, Example Embodiment 8 was represented with a one-dot chain line, and Example Embodiment 9 was represented with a two-dot chain line.

Referring to FIG. 8, it shows that the emission intensity of Example Embodiment 7 as compared with Example Embodiments 8 and 9 is large in 420 nm to 480 nm which a wavelength is corresponding to a blue region. Further, it shows that the emission intensity of Example Embodiment 7 as compared with Example Embodiment 1 is large in 510 nm to 590 nm which a wavelength is corresponding to a yellow-green region. Further, it shows that the emission intensity of Example Embodiment 7 is larger than that of Example Embodiments 8 and 9 in 600 nm to 650 nm which a wavelength is corresponding to a red region.

According to an example embodiment of the present disclosure, to reduce the thickness of the electron transport layer, the refractive index of the electron transport layer may be adjusted to be high. The refractive index of the electron transport layer may be adjusted in consideration of the emission intensity.

According to an example embodiment of the present disclosure, it may be understood that when the refractive index of the electron transport layer is 1.94 or more to 2.04 or less and the thickness of the electron transport layer is 30 nm or more and/or 50 nm or less, the emission intensity is increased in a wavelength corresponding to the blue, yellow-green, and red regions.

Figure 9:
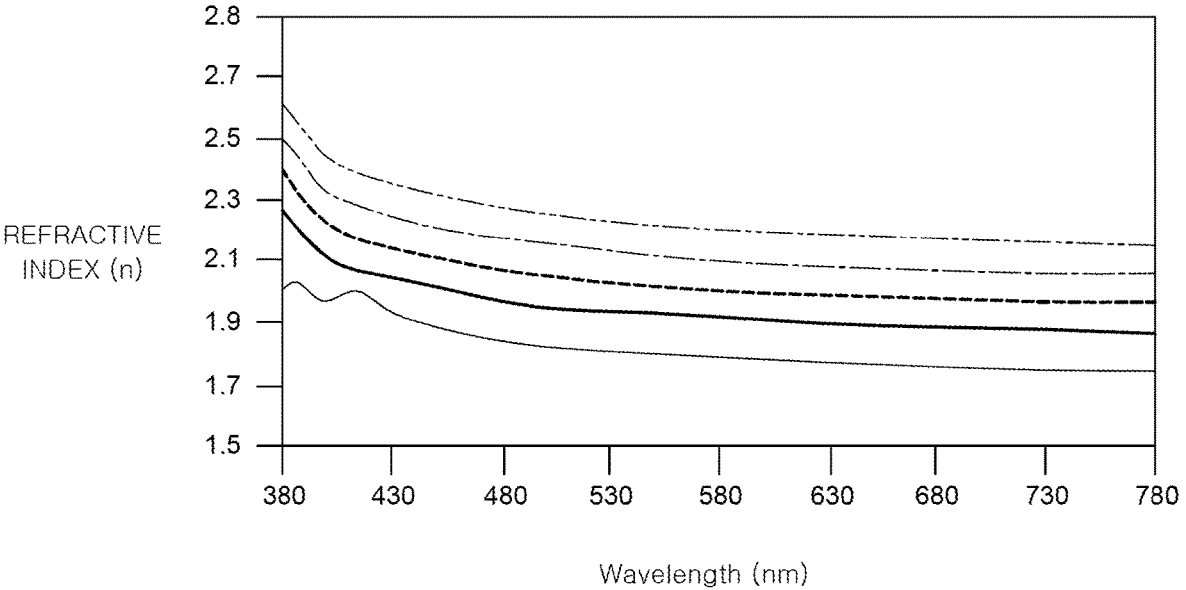
FIG. 9 illustrates a refractive index according to another example embodiment of the present disclosure.

FIG. 9 illustrates a refractive index according to an example embodiment of the present disclosure.

FIG. 9 illustrates a refractive index according to a wavelength. In FIG. 9, the horizontal axis represents a light wavelength region (nm) and the vertical axis represents the refractive index. Example Embodiment 1 was represented with a solid line. Example Embodiments 4 and 5 were represented with a thick solid line and Example Embodiment 7 was represented with a thick dotted line. Example Embodiment 8 was represented with a one-dotted chain line and Example Embodiment 9 was represented with a two-dot chain line.

Referring to FIG. 9, the refractive index of the electron transport layer of Example Embodiment 1 may be 1.72 to 1.95 in a wavelength of 380 nm to 780 nm. The refractive index of the electron transport layer of Example Embodiment 1 is 1.87 in the wavelength of 456 nm, 1.81 in the wavelength of 530 nm, and 1.77 in the wavelength of 624 nm. For example, a wavelength region of a blue is 456 nm, a wavelength region of a green is 530 nm, and a wavelength region of red is 624 nm, but example embodiments of the present disclosure are not limited thereto. For example, 456 nm which is a blue wavelength region may be a wavelength of a blue light emission peak and may be a wavelength of a maximum emission peak. For example, 530 nm which is a green wavelength region may be a wavelength of a green light emission peak and may be a wavelength of a maximum emission peak. For example, 624 nm which is a red wavelength region may be a wavelength of a red light emission peak and may be a wavelength of a maximum emission peak.

For example, the refractive index of the electron transport layer may vary for every wavelength. The refractive index of the electron transport layer of Example Embodiments 4 and 5 may be 1.86 to 2.30 in a wavelength of 380 nm to 780 nm. The refractive index of the electron transport layer of Example Embodiment 5 is 2.00 in the wavelength of 456 nm, 1.94 in the wavelength of 530 nm, and 1.90 in the wavelength of 624 nm.

The refractive index of the electron transport layer of Example Embodiment 7 may be 2.00 to 2.36 in the wavelength of 380 nm to 780 nm. The refractive index of the electron transport layer of Example Embodiment 7 is 2.10 in the wavelength of 456 nm, 2.03 in the wavelength of 530 nm, and 1.99 in the wavelength of 624 nm.

The refractive index of the electron transport layer of Example Embodiment 8 may be 2.05 to 2.50 in the wavelength of 380 nm to 780 nm. The refractive index of the electron transport layer of Example Embodiment 8 is 2.20 in the wavelength of 456 nm, 2.13 in the wavelength of 530 nm, and 2.09 in the wavelength of 624 nm.

The refractive index of the electron transport layer of Example Embodiment 9 may be 2.20 to 2.60 in the wavelength of 380 nm to 780 nm. The refractive index of the electron transport layer of Example Embodiment 9 is 2.30 in the wavelength of 456 nm, 2.23 in the wavelength of 530 nm, and 2.18 in the wavelength of 624 nm.

According to an example embodiment of the present disclosure, the refractive index of the electron transport layer of Example Embodiments 4, 5, and 7 is 2.00 or more to 2.10 or less in the wavelength of 456 nm, 1.94 or more to 2.03 or less in the wavelength of 530 nm, and 1.90 or more to 1.99 or less in the wavelength of 624 nm. A thickness of the electron transport layer of Example Embodiments 4, 5, and 7 may be 30 nm or more to 50 nm or less. It shows that as compared with Example 1, in Example Embodiments 5 and 7, the driving voltage is reduced, the red efficiency, the green efficiency, and the white efficiency are improved, and the viewing angle and the blue efficiency are equivalent to Example Embodiment 1. Accordingly, the thickness of the third electron transport layer is reduced in accordance with the refractive index of the third electron transport layer so that a display apparatus in which the efficiency and the viewing angle are improved and the driving voltage is reduced may be provided.

According to an example embodiment of the present disclosure, the refractive index of the third electron transport layer may be 1.90 or more to 2.10 or less. For example, the refractive index of the third electron transport layer may be 2.00 or more to 2.10 or less in the wavelength of 456 nm. For example, the refractive index of the third electron transport layer may be 1.94 or more to 2.03 or less in the wavelength of 530 nm. For example, the refractive index of the third electron transport layer may be 1.90 or more to 1.99 or less in the wavelength of 624 nm. According to an example embodiment of the present disclosure, the thickness of the third electron transport layer may be configured to be 30 nm or more and/or 50 nm or less. Thus, the thickness of the third electron transport layer is reduced in accordance with the refractive index of the third electron transport layer so that a display apparatus in which the efficiency and the viewing angle are improved and the driving voltage is reduced may be provided.

A display apparatus according to one or more example embodiments of the present disclosure may be applicable to or included in a mobile apparatus, a video phone, a smart watch, a watch phone, a wearable apparatus, a foldable apparatus, a rollable apparatus, a bendable apparatus, a flexible apparatus, a curved apparatus, a sliding apparatus, a variable apparatus, an electronic book, a portable multimedia player (PMP), a personal digital assistant (PDA), an MP3 player, a mobile medical apparatus, a desktop PC (personal computer), a laptop PC, a netbook computer, a workstation, a navigation, a navigation for a vehicle, an automotive navigation apparatus, a display apparatus for a vehicle, an automotive display apparatus, an apparatus for a vehicle, an automotive apparatus, a theater apparatus, a theater display apparatus, a television, a wallpaper apparatus, a signage apparatus, a game apparatus, a laptop computer, a monitor, a camera, a camcorder, home appliances, and a consumer electronics device. Further, the display apparatus of the present disclosure may be also applied to or included in an organic light emitting illumination apparatus or an inorganic light emitting illumination apparatus.

A display apparatus according to tone or more embodiments of the present disclosure are described below.

A display apparatus according to one or more embodiments of the present disclosure may comprise a cathode electrode over a substrate, a first emission part over the cathode electrode, the first emission part including a first electron transport layer, a first emission layer, a first hole transport layer, and a first charge generation layer, a second emission part over the first emission part, the second emission part including a second charge generation layer, a second electron transport layer, a second emission layer, a second hole transport layer, and a third charge generation layer, a third emission part which is disposed over the second emission part, the third emission part including a fourth charge generation layer, a third electron transport layer, a third emission layer, and a third hole transport layer and an anode electrode over the third emission part. A thickness of the third electron transport layer is larger than a thickness of the second electron transport layer.

According to one or more embodiments of the present disclosure, the thickness of the third electron transport layer may be smaller than a thickness of the first electron transport layer.

According to one or more embodiments of the present disclosure, the thickness of the third electron transport layer may be larger than the thickness of the second electron transport layer and smaller than the thickness of the first electron transport layer.

According to one or more embodiments of the present disclosure, a refractive index of the third electron transport layer may be in a range from 1.90 to 2.10, inclusive.

According to one or more embodiments of the present disclosure, a thickness of the first hole transport layer may be smaller than a thickness of the third hole transport layer.

According to one or more embodiments of the present disclosure, a thickness of the first hole transport layer may be smaller than a thickness of the second hole transport layer.

According to one or more embodiments of the present disclosure, a thickness of the second hole transport layer may be larger than a thickness of the first hole transport layer and smaller than a thickness of the third hole transport layer.

According to one or more embodiments of the present disclosure, the display apparatus may further include a fifth charge generation layer between the cathode electrode and the first electron transport layer.

According to one or more embodiments of the present disclosure, a sum of the thicknesses of the first electron transport layer and the fifth charge generation layer may be larger than a sum of the thicknesses of the second charge generation layer and the second electron transport layer.

According to one or more embodiments of the present disclosure, a sum of the thicknesses of the second charge generation layer and the second electron transport layer may be smaller than a sum of the thicknesses of the fourth charge generation layer and the third electron transport layer.

According to one or more embodiments of the present disclosure, at least one or more of the first hole transport layer, the second hole transport layer, or the third hole transport layer may include two or more hole transport layers.

According to one or more embodiments of the present disclosure, the third hole transport layer includes two or more hole transport layers, and among the two or more hole transport layers of the third hole transport layer, a thickness of a hole transport layer adjacent to the third emission layer may be smaller than a thickness of a hole transport layer adjacent to the anode electrode.

According to one or more embodiments of the present disclosure, the cathode electrode may be adjacent to the first electron transport layer and the anode electrode may be adjacent to the third hole transport layer.

According to one or more embodiments of the present disclosure, at least two or more of the first emission layer, the second emission layer, or the third emission layer may be configured to emit a same color light.

According to one or more embodiments of the present disclosure, the first emission layer and the third emission layer may be configured to emit a same color light.

According to one or more embodiments of the present disclosure, the first emission layer and the third emission layer may include a blue emission layer.

According to one or more embodiments of the present disclosure, the second emission layer may include one or more of a yellow-green emission layer, a green emission layer, or a yellow-green emission layer and a green emission layer.

According to one or more embodiments of the present disclosure, the second emission layer may include one or more of a red emission layer, a yellow-green emission layer, or a green emission layer, or one of combinations thereof.

According to one or more embodiments of the present disclosure, the display apparatus may further comprise a hole injection layer over the third hole transport layer.

A display apparatus according to one or more embodiments of the present disclosure may comprise a first electrode and a second electrode over a substrate, a first emission part over the first electrode, the first emission part being between a first charge generation layer and a second charge generation layer, a second emission part over the first emission part, the second emission part being between a third charge generation layer and a fourth charge generation layer and a third emission part over the second electrode, the third emission part being between a fifth charge generation layer and a second electrode. A thickness of the third emission part may be larger than a thickness of the second emission part.

According to one or more embodiments of the present disclosure, a thickness of the third emission part may be equal to or smaller than a thickness of the first emission part.

According to one or more embodiments of the present disclosure, a thickness of the second emission part may be smaller than the thickness of the first emission part.

According to one or more embodiments of the present disclosure, the first emission part may include a first electron transport layer, a first emission layer, and a first hole transport layer over the first charge generation layer. The second emission part may include a second electron transport layer, a second emission layer, and a second hole transport layer over the third charge generation layer. The third emission part may include a third electron transport layer, a third emission layer, and a third hole transport layer over the fifth charge generation layer.

According to one or more embodiments of the present disclosure, a thickness of the third electron transport layer may be larger than a thickness of the second electron transport layer.

According to one or more embodiments of the present disclosure, the thickness of the third electron transport layer may be smaller than a thickness of the first electron transport layer.

According to one or more embodiments of the present disclosure, a sum of the thicknesses of the first charge generation layer and the first electron transport layer may be larger than a sum of the thicknesses of the third charge generation layer and the second electron transport layer.

According to one or more embodiments of the present disclosure, a sum of the thicknesses of the third charge generation layer and the second electron transport layer may be smaller than a sum of the thicknesses of the fifth charge generation layer and the third electron transport layer.

According to one or more embodiments of the present disclosure, a refractive index of the third electron transport layer may be 1.90 to 2.10, inclusive.

According to one or more embodiments of the present disclosure, at least one or more of the first hole transport layer, the second hole transport layer, or the third hole transport layer may include two or more hole transport layers.

According to one or more embodiments of the present disclosure, the third hole transport layer includes two or more hole transport layers, and among the two or more hole transport layers of the third hole transport layer, a thickness of a hole transport layer adjacent to the third emission layer may be smaller than a thickness of a hole transport layer adjacent to the second electrode.

According to one or more embodiments of the present disclosure, the first electrode may be a cathode electrode and the second electrode may be an anode electrode.

According to one or more embodiments of the present disclosure, the cathode electrode may be disposed to be adjacent to the first electron transport layer and the anode electrode may be disposed to be adjacent to the third hole transport layer.

According to one or more embodiments of the present disclosure, at least two or more of the first emission layer, the second emission layer, or the third emission layer may be configured to emit same color light.

According to one or more embodiments of the present disclosure, the first emission layer and the third emission layer may be configured to emit same color light.

According to one or more embodiments of the present disclosure, the first emission layer and the third emission layer may include a blue emission layer.

According to one or more embodiments of the present disclosure, the second emission layer may include one of a yellow-green emission layer, a green emission layer, or a yellow-green emission layer and a green emission layer.

According to one or more embodiments of the present disclosure, the second emission layer may include one or more of a red emission layer, a yellow-green emission layer, or a green emission layer, or one of combinations thereof.

According to one or more embodiments of the present disclosure, the display apparatus may further include a hole injection layer over the third hole transport layer.

According to one or more embodiments of the present disclosure, the display apparatus may further include a thin film transistor disposed over the substrate, an insulating layer over the thin film transistor and a color filter over the insulating layer.

According to one or more embodiments of the present disclosure, the display apparatus may further include an overcoating layer over the color filter and a bank overlapping a portion of the cathode electrode.

According to one or more embodiments of the present disclosure, the display apparatus may further include a gate line and a data line over the substrate. The display apparatus may include a first transistor which applies a data voltage according to a gate signal applied to the gate line, a second transistor applied with a data voltage which is applied from the data line, a storage capacitor connected between a node between the first transistor and the second transistor and a source electrode of the second transistor.

According to one or more embodiments of the present disclosure, the first transistor and the second transistor may include semiconductor layers and at least one or more of the semiconductor layers in each of the first transistor and second transistor may include an oxide semiconductor layer.

It will be apparent to those skilled in the art that various modifications and variations can be made in the display apparatus of the present disclosure without departing from the scope of the present disclosure. Thus, it is intended that the present disclosure covers the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a cathode electrode over a substrate;
a first emission part over the cathode electrode, the first emission part including a first electron transport layer, a first emission layer, a first hole transport layer, and a first charge generation layer;
a second emission part over the first emission part, the second emission part including a second charge generation layer, a second electron transport layer, a second emission layer, a second hole transport layer, and a third charge generation layer;
a third emission part over the second emission part, the third emission part including a fourth charge generation layer, a third electron transport layer, a third emission layer, and a third hole transport layer; and
an anode electrode over the third emission part,
wherein a thickness of the third electron transport layer is larger than a thickness of the second electron transport layer.

2. The display apparatus of claim 1, wherein the thickness of the third electron transport layer is smaller than a thickness of the first electron transport layer.

3. The display apparatus of claim 1, wherein a refractive index of the third electron transport layer is in a range from 1.90 to 2.10, inclusive.

4. The display apparatus of claim 1, wherein a thickness of the second hole transport layer is larger than a thickness of the first hole transport layer and smaller than a thickness of the third hole transport layer.

5. The display apparatus of claim 1, further comprising:
a fifth charge generation layer between the cathode electrode and the first electron transport layer.

6. The display apparatus of claim 5, wherein a sum of thicknesses of the first electron transport layer and the fifth charge generation layer is larger than a sum of thicknesses of the second charge generation layer and the second electron transport layer.

7. The display apparatus of claim 1, wherein a sum of thicknesses of the second charge generation layer and the second electron transport layer is smaller than a sum of thicknesses of the fourth charge generation layer and the third electron transport layer.

8. The display apparatus of claim 1, wherein at least one or more of the first hole transport layer, the second hole transport layer, or the third hole transport layer includes two or more hole transport layers.

9. The display apparatus of claim 8, wherein the third hole transport layer includes two or more hole transport layers, and among the two or more hole transport layers of the third hole transport layer, a thickness of a hole transport layer adjacent to the third emission layer is smaller than a thickness of a hole transport layer adjacent to the anode electrode.

10. The display apparatus of claim 1, wherein the cathode electrode is adjacent to the first electron transport layer and the anode electrode is adjacent to the third hole transport layer.

11. The display apparatus of claim 1, wherein at least two or more of the first emission layer, the second emission layer, or the third emission layer are configured to emit a same color light.

12. The display apparatus of claim 1, wherein the first emission layer and the third emission layer are configured to emit a same color light.

13. The display apparatus of claim 1, wherein the first emission layer and the third emission layer include a blue emission layer.

14. The display apparatus of claim 1, wherein the second emission layer includes one or more of a yellow-green emission layer, a green emission layer, or a yellow-green emission layer and a green emission layer.

15. The display apparatus of claim 1, wherein the second emission layer includes one or more of a red emission layer, a yellow-green emission layer, or a green emission layer, or one of combinations thereof.

16. The display apparatus of claim 1, further comprising:
a hole injection layer over the third hole transport layer.

17. A display apparatus, comprising:
a first electrode and a second electrode over a substrate;
a first emission part over the first electrode, the first emission part being between a first charge generation layer and a second charge generation layer;
a second emission part over the first emission part, the second emission part being between a third charge generation layer and a fourth charge generation layer; and
a third emission part over the second emission part, the third emission part being between a fifth charge generation layer and the second electrode,
wherein a thickness of the third emission part is larger than a thickness of the second emission part.

18. The display apparatus of claim 17, wherein the thickness of the third emission part is equal to or smaller than a thickness of the first emission part.

19. The display apparatus of claim 18, wherein the thickness of the second emission part is smaller than a thickness of the first emission part.

20. The display apparatus of claim 17, wherein the first emission part includes a first electron transport layer, a first emission layer, and a first hole transport layer over the first charge generation layer,
wherein the second emission part includes a second electron transport layer, a second emission layer, and a second hole transport layer over the third charge generation layer, and
wherein the third emission part includes a third electron transport layer, a third emission layer, and a third hole transport layer over the fifth charge generation layer.

21. The display apparatus of claim 20, wherein a thickness of the third electron transport layer is larger than a thickness of the second electron transport layer.

22. The display apparatus of claim 20, wherein a thickness of the third electron transport layer is smaller than a thickness of the first electron transport layer.

23. The display apparatus of claim 20, wherein a sum of the thicknesses of the first charge generation layer and the first electron transport layer is larger than a sum of the thicknesses of the third charge generation layer and the second electron transport layer.

24. The display apparatus of claim 20, wherein a sum of the thicknesses of the third charge generation layer and the second electron transport layer is smaller than a sum of the thicknesses of the fifth charge generation layer and the third electron transport layer.

25. The display apparatus of claim 20, wherein a refractive index of the third electron transport layer is in a range from 1.90 to 2.10, inclusive.

26. The display apparatus of claim 20, wherein at least one or more of the first hole transport layer, the second hole transport layer, or third hole transport layer include two or more hole transport layers.

27. The display apparatus of claim 26, wherein the third hole transport layer includes two or more hole transport layers, and among the two or more hole transport layers of the third hole transport layer, a thickness of a hole transport layer adjacent to the third emission layer is smaller than a thickness of a hole transport layer adjacent to the second electrode.

28. The display apparatus of claim 17, wherein the first electrode is a cathode electrode and the second electrode is an anode electrode.

* * * * *